US012769895B2

(12) United States Patent
Krishnamurthy et al.

(10) Patent No.: US 12,769,895 B2
(45) Date of Patent: Oct. 20, 2026

(54) SYSTEMS AND METHODS FOR CREATING SPACE-FILLING SOLID MODELS

(71) Applicant: The Texas A&M University System, College Station, TX (US)

(72) Inventors: Vinayak Raman Krishnamurthy, College Station, TX (US); Ergun Akleman, College Station, TX (US); Sai Ganesh Subramanian, College Station, TX (US); Matthew Ebert, Magnolia, TX (US)

(73) Assignee: The Texas A&M University System, College Station, TX (US)

( * ) Notice: Subject to any disclaimer, the term of this patent is extended or adjusted under 35 U.S.C. 154(b) by 1172 days.

(21) Appl. No.: 17/782,583

(22) PCT Filed: Dec. 7, 2020

(86) PCT No.: PCT/US2020/063650
§ 371 (c)(1),
(2) Date: Jun. 3, 2022

(87) PCT Pub. No.: WO2021/113836
PCT Pub. Date: Jun. 10, 2021

(65) Prior Publication Data

US 2023/0011393 A1 Jan. 12, 2023

Related U.S. Application Data

(60) Provisional application No. 62/944,910, filed on Dec. 6, 2019.

(51) Int. Cl.
*G06F 30/10* (2020.01)

(52) U.S. Cl.
CPC .................................... *G06F 30/10* (2020.01)

(58) Field of Classification Search
CPC ................................ G06F 30/10; G06F 30/17
See application file for complete search history.

(56) References Cited

U.S. PATENT DOCUMENTS 6,309,716 B1 * 10/2001 Fisher ...................... B44C 3/12 273/293
2005/0037826 A1 2/2005 Rupert et al.

OTHER PUBLICATIONS

Vella, et al., "Geometric Versatility of Abeille Vault," Shape, Form and Geometry Applications—vol. 2. (Year: 2019).*
Boada, et al., "Approximations of 3D Generalized Voronoi Diagrams," EWCG 2005, Eindhoven. (Year: 2005).*

(Continued)

*Primary Examiner* — Ryan F Pitaro
*Assistant Examiner* — Joseph P Morris
(74) *Attorney, Agent, or Firm* — Conley Rose, P.C.

(57) ABSTRACT

A method for creating a space-filling solid model includes (a) defining a three-dimensional (3D) domain, (b) defining a Voronoi site geometry for each of a plurality of Voronoi sites, (c) defining a spatial arrangement of the plurality of Voronoi sites, (d) arranging the plurality of Voronoi sites within the 3D domain according to the defined spatial arrangement, and (e) partitioning the 3D domain based on the Voronoi site geometry of each the plurality of Voronoi sites defined in (b) and the spatial arrangement of the plurality of Voronoi sites defined in (c) using a distance function to create the space-filling solid model.

18 Claims, 16 Drawing Sheets

(56) References Cited

OTHER PUBLICATIONS

Gomez-Galvez, et al., "Scutoids are a geometrical solution to three-dimensional packing of epithelia," Nature Communications 9:2960. (Year: 2018).*

Sai Ganesh Subramanian et al.; "Delaunay Lofts: A biologically inspired approach for modeling space filling modular structures", Computers & Graphics, vol. 82, pp. 73-83, May 29, 2019.

Nicolas Ray et al., "Meshless Voronoi on the GPU", ACM Transactions on Graphics, vol. 37, No. 6, Nov. 2018.

Helen Oleynikova et al., "Sparse 3D Topological Graphs for Micro-Aerial Vehicle Planning", arxiv:1803.04345v2, Jul. 24, 2018.

Swantje Bargmann et al., "Generation of 3D representative volume elements for heterogenous materials: A review", Progress in Materials Science, vol. 96, pp. 322-384, Mar. 26, 2018.

International Search Report and Written Opinion dated Mar. 31, 2021 for Application No. PCT/US2020/063650.

* cited by examiner

SYSTEMS AND METHODS FOR CREATING SPACE-FILLING SOLID MODELS

CROSS-REFERENCE TO RELATED APPLICATIONS

This application a 35 U.S.C. § 371 national stage application of PCT/US2020/063650 filed Dec. 7, 2020, and entitled "Systems and Methods for Creating Space-Filling Solid Models", which claims benefit of U.S. provisional patent application Ser. No. 62/944,910 filed Dec. 6, 2019, and entitled "Methods for Generating Three Dimensional Structures," both of which are hereby incorporated herein by reference in their entirety for all purposes.

STATEMENT REGARDING FEDERALLY SPONSORED RESEARCH OR DEVELOPMENT

Not applicable.

BACKGROUND

Computer-aided design (CAD) includes the employment of computers, such as software executing on a computer system, in the creation, analysis, and optimization of designs, including solid shapes. CAD may be based on forward design strategies employing a parametric design workflow. The parametric design workflow may include a designer using CAD software executing on a computer system to create a model by combining several relatively simple geometric primitives (e.g., extrusions, sweeps, etc.). Alternatively, CAD may be based on an inverse design strategy in which the designer provides CAD software executing on a computer system with one or more design requirements as inputs. The CAD software may create a plurality of models algorithmically based on the provided inputs and the designer may select one of the plurality of models created by the CAD software.

BRIEF SUMMARY OF THE DISCLOSURE

An embodiment of a method for creating a space-filling solid model comprises (a) defining a three-dimensional (3D) domain, (b) defining a Voronoi site geometry for each of a plurality of Voronoi sites, (c) defining a spatial arrangement of the plurality of Voronoi sites, (d) arranging the plurality of Voronoi sites within the 3D domain according to the defined spatial arrangement, and (e) partitioning the 3D domain based on the Voronoi site geometry of each the plurality of Voronoi sites defined in (b) and the spatial arrangement of the plurality of Voronoi sites defined in (c) using a distance function to create the space-filling solid model. In some embodiments, the space-filling solid model comprises a plurality of repeating parts in a plurality of orientations, wherein each part is formed from one Voronoi site of the plurality of Voronoi sites. In some embodiments, the spatial arrangement comprises a weave symmetry and the plurality of repeating parts are geometrically locked. In certain embodiments, the Voronoi site geometry comprises a weave line. In certain embodiments, the spatial arrangement comprises a weave symmetry and the plurality of repeating parts are topologically locked, and wherein the plurality of repeating parts comprise Generalized Abeille Tiles. In some embodiments, the spatial arrangement comprises a wallpaper symmetry and the plurality of repeating parts are topologically locked, and wherein the plurality of repeating parts comprise Delaunay Lofts. In some embodiments, (e) comprises (e1) dividing the 3D domain into a plurality of two-dimensional (2D) stacked layers, (e2) partitioning each of the 2D stacked layers based on the defined Voronoi site geometry of the plurality of Voronoi sites using the distance function, and (e3) interpolating, layer-by-layer, the partitioned 2D stacked layers to create the space-filling solid model.

An embodiment of a method for creating a space-filling solid model comprises (a) defining a three-dimensional (3D) domain, (b) defining a Voronoi site geometry for each of a plurality of Voronoi sites, (c) arranging the plurality of Voronoi sites within the 3D domain, (d) dividing the 3D domain into a plurality of two-dimensional (2D) stacked layers, (e) partitioning each of the 2D stacked layers based on the Voronoi site geometry of each of the plurality of Voronoi sites defined in (b) using a distance function, and (f) interpolating, layer-by-layer, the partitioned 2D stacked layers to create the space-filling solid model. In some embodiments, the space-filling solid model comprises a plurality of repeating parts in a plurality of orientations, wherein each part is formed from one Voronoi site of the plurality of Voronoi sites. In some embodiments, the plurality of repeating parts comprise woven threads that are geometrically interlocked. In certain embodiments, each of the woven threads comprises a plurality of separable sub-tiles. In certain embodiments, each of the plurality of separable sub-tiles is hollow, wherein each of the plurality of separable sub-tiles comprises a connector located at an end thereof and a port, and wherein the plurality of separable sub-tiles are connected end-to-end to form the woven thread. In some embodiments, the space-filling solid model comprises a connector and the plurality of repeating parts are geometrically interlocked.

An embodiment of a non-transitory machine-readable medium includes instructions that, when executed by a processor, cause the processor to define a three-dimensional (3D) domain, define a Voronoi site geometry for each of a plurality of Voronoi sites, define a spatial arrangement of the plurality of Voronoi sites, arrange the plurality of Voronoi sites within the 3D domain according to the defined spatial arrangement, and partition the 3D domain based on the defined Voronoi site geometry of each of the plurality of Voronoi sites and the defined spatial arrangement of the plurality of Voronoi sites using a distance function to create a space-filling solid model. In some embodiments, the space-filling solid model comprises a plurality of repeating parts in a plurality of orientations, wherein each part is formed from one Voronoi site of the plurality of Voronoi sites. In some embodiments, the spatial arrangement comprises a weave symmetry and the plurality of repeating parts are topologically locked, and wherein the plurality of repeating parts comprise Generalized Abeille Tiles. In certain embodiments, the spatial arrangement comprises a wallpaper symmetry and the plurality of repeating parts are topologically locked, and wherein the plurality of repeating parts comprise Delaunay Lofts. In some embodiments, the plurality of repeating parts comprise woven threads that are geometrically interlocked, and wherein each of the woven threads comprises a plurality of separable sub-tiles, and each of the plurality of separable sub-tiles is hollow, wherein each of the plurality of separable sub-tiles comprises a connector located at an end thereof and a port, and wherein the plurality of separable sub-tiles are connected end-to-end to form the woven thread. In some embodiments, the instructions, when executed by a processor, cause the processor to define at least one of the three-dimensional (3D) domain, the Voronoi site geometry, and the spatial arrangement of the plurality of Voronoi sites based on a desired behavior of the space-filling solid model inputted by a user. In some embodiments, the instructions, when executed by a processor, cause the processor to divide the 3D domain into a plurality of two-dimensional (2D) stacked layers, partition each of the 2D stacked layers based on the defined Voronoi site geometry of the plurality of Voronoi sites using the distance function, and interpolate, layer-by-layer, the partitioned 2D stacked layers to create the space-filling solid model.

BRIEF DESCRIPTION OF THE DRAWINGS

For a detailed description of exemplary embodiments of the invention, reference will now be made to the accompanying drawings in which.

DETAILED DESCRIPTION

Figure 1:
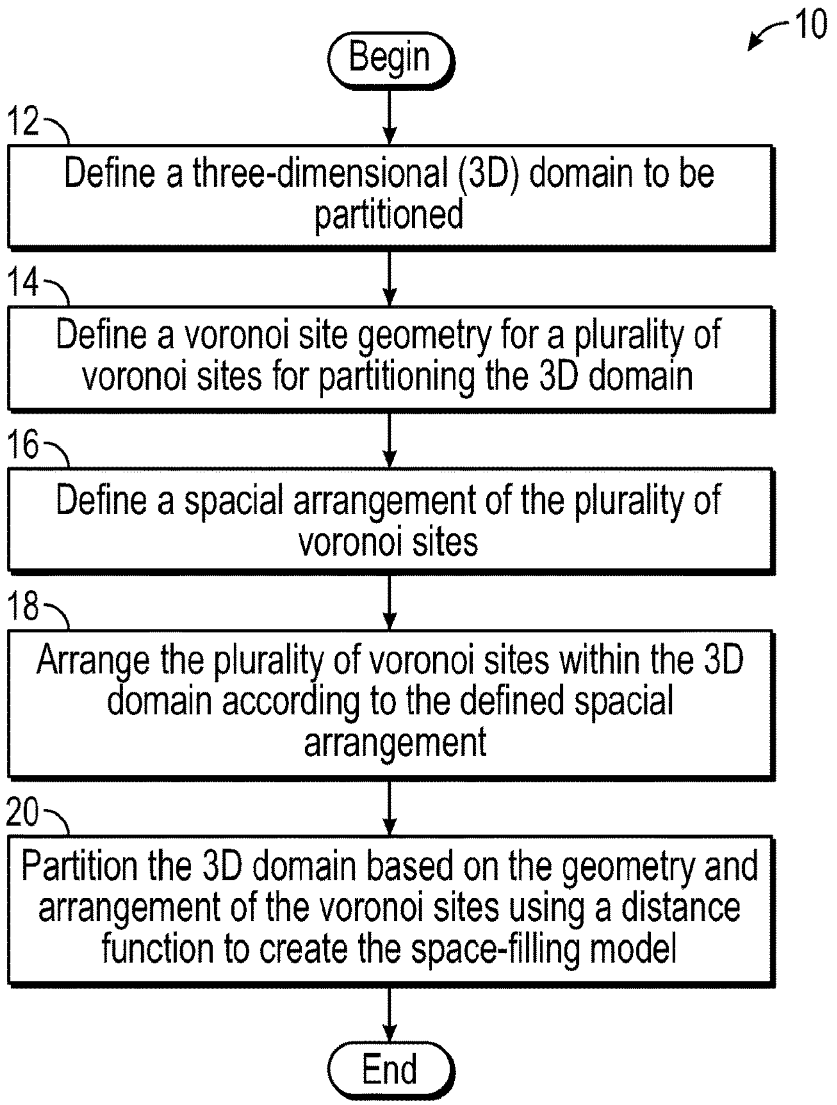
FIG. 1 is a flowchart illustrating a method for creating space-filling solid models according to some embodiments.

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

Unless the context dictates the contrary, all ranges set forth herein should be interpreted as being inclusive of their endpoints, and open-ended ranges should be interpreted to include only commercially practical values. Similarly, all lists of values should be considered as inclusive of intermediate values unless the context indicates the contrary.

In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct engagement between the two devices, or through an indirect connection that is established via other devices, components, nodes, and connections. In addition, as used herein, the terms "axial" and "axially" generally mean along or parallel to a particular axis (e.g., central axis of a body or a port), while the terms "radial" and "radially" generally mean perpendicular to a particular axis. For instance, an axial distance refers to a distance measured along or parallel to the axis, and a radial distance means a distance measured perpendicular to the axis. As used herein, the terms "approximately," "about," "substantially," and the like mean within 10% (i.e., plus or minus 10%) of the recited value. Thus, for example, a recited angle of "about 80 degrees" refers to an angle ranging from 72 degrees to 88 degrees.

As described above, CAD may employ several design strategies, including, for example, forward design strategies and inverse design strategies. Forward design strategies such as, for example, constructive solid geometry, may include forming a model through combining simple geometric primitives. However, such a design strategy may not be suitable for the design of complex shapes or models given the amount of time required of the designer employing such a strategy in manually creating numerous geometric primitives and combining the primitives into more complex shapes.

Alternatively, inverse design strategies, which may include topology optimization and generative design, include CAD software creating a plurality of models based on one or more (desired behavior) inputs provided by a designer, the one or more inputs including design requirements or constraints. Thus, rather than providing inputs in the form of the structural features of a solid model as in forward design strategies, in inverse design strategies the designer may instead provide an input corresponding to a desired behavior of the solid model. Although inverse design strategies may allow for the relatively quick creation of complex shapes unlike forward design strategies, inverse design strategies may require the designer to engage in the cumbersome process of sifting through a large number of models generated by the CAD software in order to select a preferred model. Additionally, in inverse design strategies, the designer may lose direct interaction and manipulation of the model during its creation which instead is handled algorithmically by the CAD software. Thus, the designer may forfeit direct control over the form of the selected model which is instead created by the CAD software. Additionally, given that the way in which the models are created by the CAD software is hidden from the designer, it is difficult for the designer to intuit or appreciate what shapes or models will result from a given set of inputs, how the resulting models conform to the inputs, and how the resulting models could potentially fail. In other words, the resulting models created by the CAD software based on the inputs provided by the designer may be unpredictable to the designer, making it difficult for the designer to compare the resulting models when selecting a model to be used in a product. Moreover, the understanding of how to craft a list of inputs that will produce a satisfactory model requires an experiential understanding of how form, function, and behavior of the created models are linked, and this understanding may be difficult to obtain for a designer when the process by which models are created is not understood or unknown by the designer.

Accordingly, embodiments of systems and methods for creating space-filling solid models using partitive solid geometry disclosed herein which address at least some of the issues pertaining to current CAD strategies including, for example, forward design strategies as well as inverse design strategies. Particularly, partitive solid geometry design strategies disclosed herein allow for the efficient and rapid creation of complex solid shapes while also making the process of evaluating created designs for inverse design intelligible for the designer. Partitive solid geometry may allow a designer to quickly create a family of "tileable" space-filling shapes or "building blocks" in which there are no voids between the tiled shapes. In some embodiments, design strategies employing partitive solid geometry may be performed by a designer using software executing on a computer system. The computer system may comprise a single, discrete computer or one or more servers accessible by the user through a network, such as the Internet.

Partitive solid geometry enables the design of a wide range of shapes providing a wide range of functionality and mechanical properties. For example, models created using partitive solid geometry may be used in creating tools for designing, predicting, and analyzing internal geometry of sheet-like structures ranging from nanoscale to macroscale artifacts, as well for predicting and visualizing cracks in physical structures and for manufacturing thin structures with increased shear and torsional strength. Additionally, models created using partitive solid geometry may be used in creating tools utilized in architectural design having the capability of designing a single building or a complete city with non-linear and optimized building-road layouts. Further, models created using partitive solid geometry may be used in creating tools for generating structurally robust infill patterns in additive manufacturing processes, for generating patterned vents for optimal fluid flow and heat transfer mechanisms, as well as in creating ornamental designs for jewelry, modular furniture, and other consumer products utilizing modular design or packaging efficiency.

Design strategies using partitive solid geometry generally employ Voronoi decomposition within a predefined three-dimensional (3D) domain. Particularly, partitive solid geometry may include partitioning the 3D domain using Voronoi decomposition based on a geometry and an arrangement of a plurality of Voronoi sites positioned in the 3D domain. Partitioning the 3D domain using Voronoi decomposition may allow for changing the topology of a created shape unlike some geometric primitives like extrude or sweep operations, making partitive solid geometry a more powerful tool for creating complex shapes than conventional forward design strategies. Additionally, and as will be discussed further herein, a designer using partitive solid geometry to create a solid model may have direct control over the definition of the 3D domain, the geometry and arrangement of Voronoi sites within the 3D domain, and the selection of a distance function configured to partition the 3D domain based on the geometry and arrangement of the Voronoi sites configured by the designer. In this manner, the designer may have direct control over the shape creation process and thereby providing a more streamlined, intuitive process for creating solid models compared to conventional inverse design strategies. Design strategies using partitive solid geometry may leverage geometric principles of growth in physical, chemical, and biological systems, making partitive solid geometry suitable for design applications.

Further, embodiments of design strategies disclosed herein may allow users to create space-filling solid models by controlling the geometry and/or arrangement of elements (e.g., geometry and/or arrangement of Voronoi sites, geometry of the domain to be partitioned, etc.) in a manner corresponding to a forward design strategy, and/or by controlling the behavior of the space-filling solid model and allowing an algorithm executing on a computer system to optimize the geometry and/or arrangement of elements of the solid model to provide the user-defined behavior in a manner corresponding to an inverse design strategy. In other words, the user may provide inputs corresponding to the structural features of the space-filling model and/or the behavior of the space filling model using partitive solid geometry such that the user may leverage the strengths of both forward and inverse design strategies when creating space-filling solid models.

Figure 2:
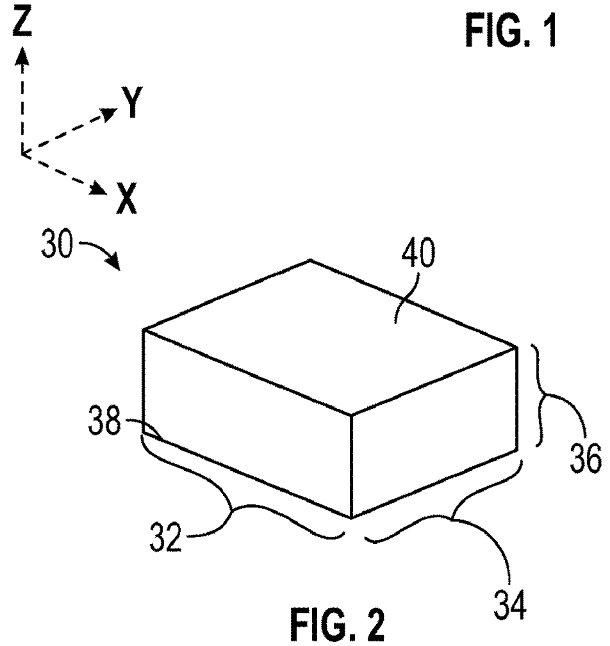
FIG. 2 is a perspective view of a 3D domain of a space-filling model according to some embodiments.

Referring now to FIG. 1, an embodiment of a method 10 for creating space-filling solid models using partitive solid geometry is shown. Beginning at block 12, method 10 includes defining a 3D domain to be partitioned. For instance, referring briefly to FIG. 2, an exemplary embodiment of a 3D domain 30 is shown. In FIG. 2, domain 30 is a rectangular prism or cuboid having a length 32 extending along a first or "X" dimension, a width 34 extending along a second or "Y" dimension, and a height 36 extending along a third or "Z" dimension. The 3D domain 30 also has a first or lower end 38 defined by a lower planar surface and a second or upper end 40 defined by an upper planar surface that is spaced from the lower planar surface. Although the exemplary 3D domain 30 shown in FIG. 2 is a rectangular prism, in other embodiments, the geometry of the 3D domain may comprise other geometry such as polyhedra other than rectangular prisms, as well as solid shapes that are not polyhedra and instead have curved external surfaces. For example, the geometry of the 3D domain may be spherical, cylindrical, toroidal, etc.

Referring again to FIG. 1, method 10 includes defining a Voronoi site geometry for a plurality of Voronoi sites for partitioning the 3D domain at block 14. For instance, referring briefly to FIG. 3, an exemplary embodiment of a Voronoi site 50 is shown. Voronoi site 50 is 3D and linear, and has a complex geometry that extends along X and Y dimensions as well as the Z-dimension between a first or lower end 52 and a second or upper end 54. In this embodiment, a height of Voronoi site 50 extending between lower and upper ends 52, 54 may be equal to the height 36 of 3D domain 30 shown in FIG. 2 while a length and a width of Voronoi site 50 may each be less than the length 32 and width 34, respectively, of 3D domain 30. Thus, a plurality of the Voronoi site 50 may be arranged within the 3D domain 30, with each Voronoi site 50 extending from the lower end 38 to the upper end 40 of 3D domain 30.

In this embodiment, the complex shape of the linear Voronoi site 50 includes a first or lower V-segment 56 and a second or upper V-segment 58 that extends in the opposite direction of lower V-segment 56 from a joint 60 positioned between V-segments 56, 58. Additionally, upper V-segment 58 is oriented at a 90-degree angle from lower V-segment 156 with respect to the Z-dimension. Voronoi site 50 has a specific orientation with respect to the Z-dimension with Voronoi site 50 being shown in FIG. 3 in a first orientation 62 relative to the Z-dimension. As will be discussed further herein, while in this embodiment Voronoi site 50 is linear and has a complex shape, in other embodiments, the geometry of Voronoi site 50 may vary.

Referring again to FIG. 1, method 10 also includes defining a spatial arrangement or symmetry of the plurality of Voronoi sites at block 16. For instance, referring briefly to FIG. 4, an exemplary embodiment of a spatial arrangement or symmetry 70 of Voronoi sites is shown. Spatial arrangement 70 includes a 2D or two-and-a-half-dimensional (2.5D) arrangement having weave symmetry with a first plurality of Voronoi sites (shown schematically in FIG. 4) disposed in a first orientation 72 and woven together with a second plurality of the Voronoi sites that are disposed in a second orientation 74 spaced 90-degrees from the first orientation 72 with respect to the Z-dimension. In some embodiments, the Voronoi sites arranged in spatial arrangement 70 may comprise Voronoi sites 50 shown in FIG. 3; however, in other embodiments, the Voronoi sites arranged in spatial arrangement 70 may vary. Additionally, and as will be described further herein, the spatial arrangement may vary from the spatial arrangement 70 shown in FIG. 4.

Figure 3:
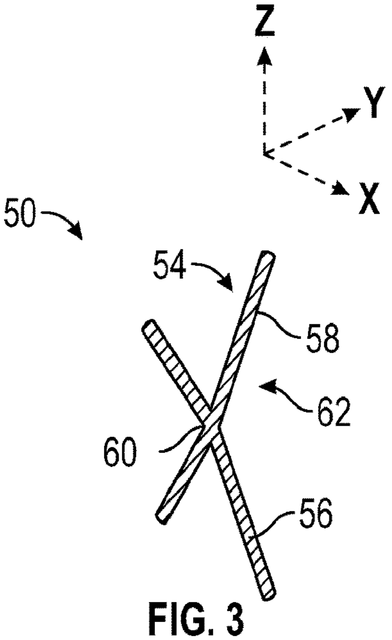
FIG. 3 is a perspective view of a Voronoi site of the space-filling model of FIG. 2 according to some embodiments.
Figure 4:
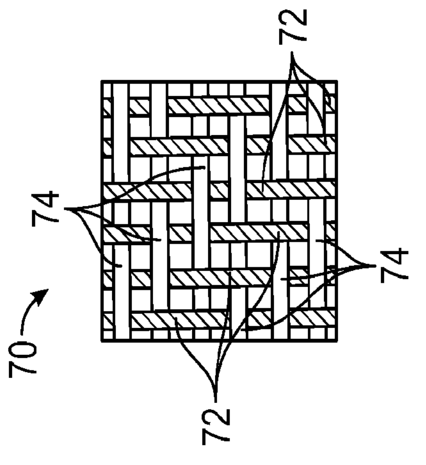
FIG. 4 is a schematic view of a spatial arrangement of a plurality of the Voronoi sites of FIG. 3 according to some embodiments.
Figure 5:
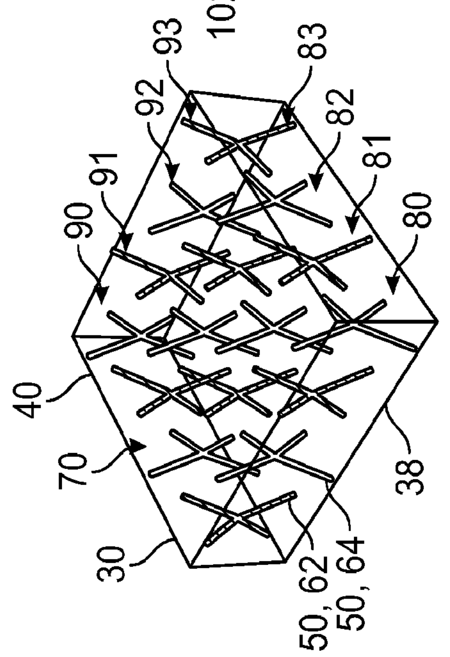
FIG. 5 is a perspective view of a plurality of the Voronoi sites of FIG. 3 arranged in the 3D domain of FIG. 2.

Referring again to FIG. 1, method 10 further includes arranging the plurality of Voronoi sites within the 3D domain according to the defined spatial arrangement at block 18. For instance, referring briefly to FIG. 5, in an exemplary embodiment, a plurality of the Voronoi sites 50 of FIG. 3 are arranged according to spatial arrangement 70 of FIG. 4 in the 3D domain 30 of FIG. 2. In the embodiment of FIG. 5, Voronoi sites 50 are arranged in rows 80-83 (evenly spaced along the width 34 of 3D domain 30) and columns 90-93 (evenly spaced along the length 32 of 3D domain 30) in accordance with spatial arrangement 70 whereby each row 80-83 and each column 90-93 includes an alternating, checkerboard pattern of Voronoi sites 50 having the first orientation 62 and Voronoi sites 50 having the second orientation 64 that is spaced 90-degrees from the first orientation 62 with respect to the Z-dimension. In the spatial arrangement 70 of Voronoi sites 50, each Voronoi site 50 is spaced from adjacently positioned Voronoi sites 50 in both the X and Y dimensions. Additionally, in this embodiment, each of the Voronoi sites 50 extend entirely between the lower end 38 and the upper end 40 of 3D domain 30.

Referring again to FIG. 1, method 10 includes partitioning the 3D domain based on the geometry and arrangement of the Voronoi sites using a distance function to create the space-filling model at block 20. For instance, referring briefly to FIG. 6, an exemplary embodiment of a space-filling solid model 100 is shown. In this embodiment, the space-filling model 100 includes a plurality of repeating and interlocking parts 101 (only some of which are labeled in FIG. 6 in the interest of clarity) oriented in a first orientation 102 and in a second orientation 104 (only some of which are labeled in FIG. 6 in the interest of clarity). Each of the parts 101 oriented in the first orientation 102 is formed from and corresponds to one of the Voronoi sites 50 disposed in the first orientation 62, while each of the parts 101 oriented in the second orientation 104 is formed from and corresponds to one of the Voronoi sites 50 disposed in the second orientation 64. Each of the parts 101 oriented in both the first and second orientations 102, 104 extends entirely between the lower end 38 and the upper end 40 of 3D domain 30. It should be appreciated that solid model 100 includes a space-filling model such that there are no voids formed between any adjacently positioned parts 101 oriented in the first and second orientations 102, 104.

The creation of solid model 100 is achieved through Voronoi partitioning of the 3D domain 30. Voronoi partitioning generally includes the partitioning of a domain (e.g., a 2D or a 3D domain) using Voronoi sites such that the domain is partitioned into a plurality of parts, each part containing exactly one Voronoi site, and where every point in the given part is closer to its Voronoi site than to any other Voronoi site within the domain. For example, a plane may be partitioned via Voronoi partitioning with Voronoi sites (comprising seed points in this example) into convex polygons such that each polygon contains exactly one seed point and every point in each polygon is closer to the polygon's seed point than to the seed point of any other polygon. Additionally, the arrangement of Voronoi sites in accordance with some symmetries result in periodic or semi-periodic tiling of a given domain in which the Voronoi sites are positioned. In addition to planes, 3D domains may be partitioned using Voronoi partitions using Voronoi sites that comprise higher dimensional entities than simple seed points. When arranged according to some spatial symmetry (e.g., spatial arrangement 70 shown in FIG. 4), higher dimensional Voronoi sites allow for the countless variety of controlled (via a designer) partitions of 3D domain such that a countable set of unique shapes can be partitioned infinitely to fill the 3D domain.

The partitioning of the 3D domain (e.g., domain 30 shown in FIG. 2) using higher dimensional Voronoi sites (e.g., Voronoi sites 50 shown in FIG. 3) may be based on a distance function configured to compute the Voronoi partition for the domain. The distance function used to compute the Voronoi partition for a given domain based on the geometry and arrangement of Voronoi sites positioned in the domain may comprise the Euclidean distance ($L_p$ Norm), weighted distance, Star Metric, Minkowski, or Quadratic Form distance functions.

In some embodiments, the 3D domain may be simplified as a sequence of 2D planar layers, each planar layer including a plurality of Voronoi sites in the form of points, where each point corresponds to one of a plurality of higher dimensional Voronoi sites positioned in the 3D domain. For example, domain 30 shown in FIG. 2 may be simplified as a sequence of 2D planar layers, each planar layer extending in the X and Y dimensions with the stacking direction being in the Z direction. Voronoi sites 50 shown in FIG. 3 extend through each of the 2D planar layers of domain 30. The intercepts between Voronoi sites 50 and a given 2D planar layer can be represented as a plurality of points from which a Voronoi decomposition or partitioning of the given 2D planar layer can be based using a distance function. In other words, the 2D planar layers may include a plurality of stacked Voronoi diagrams with the positioning of the Voronoi sites of each Voronoi diagram being defined by the higher dimensional Voronoi sites 50.

Figure 6:
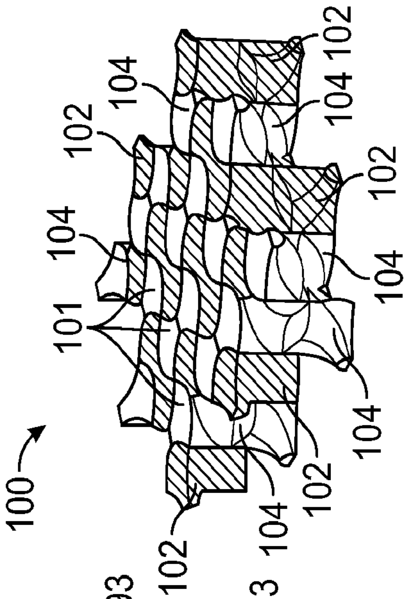
FIG. 6 is a perspective view of the space-filling model of FIG. 2 according to some embodiments.

Following the formation of a space-filling model using the method 10, such as model 100 shown in FIG. 6, a physical structure can be produced from the space-filling model. For example, a 3D, space-filling structure may be additively manufactured using a 3D printing process based on the space-filling model created at block 20 of method 10. The structure may be nano- or macroscale, and may be used for a variety of purposes (e.g., architectural structures, connectors, consumer products, aerospace structures, etc.) depending on the particular configuration of the space-filling model. Additionally, the space-filling model created at block 20 of method 10 may be used for analysis, such as finite element analysis (FEA), fluid, heat transfer analysis, or combinations thereof.

Figure 7:
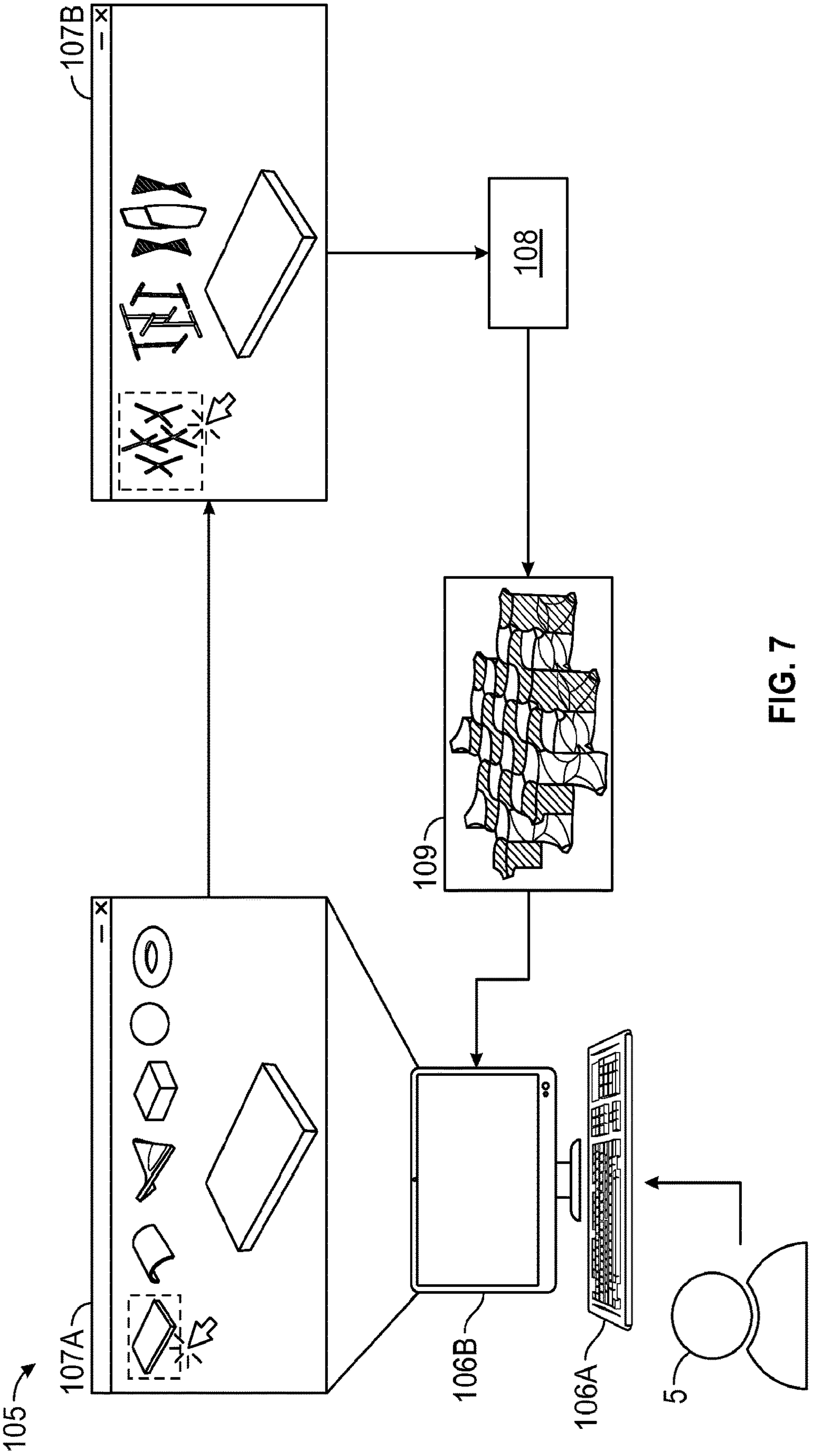
FIG. 7 is a schematic view of a system for creating space-filling solid models according to some embodiments.

Referring now to FIG. 7, an embodiment of a system 105 for creating space-filling solid models using partitive solid geometry is shown. In some embodiments, system 105 is configured to execute the method 10 shown in FIG. 1. System 105 generally includes an input device 106A, a visual display device 106B, and a computer system 108. Although, in the interest of clarity, input device 106A and display device 1066 are described as separate from the computer system 108, in some embodiments, computer system 108 may comprise input device 106A and display device 1066.

Input device 106A may comprise a keyboard, mouse, and/or other devices with which a user or designer 5 may interact. Display device 106B may comprise a monitor, a touch screen, and/or other components configured to display information visually to the designer 5. Computer system 108 is in signal communication with both the input device 106A and the display device 106B and includes a processor configured to execute machine readable instructions storable on a non-transitory machine-readable medium or memory device of the computer system 108. In some embodiments, computer system 108 comprises a personal computer (e.g., a desktop computer, a laptop, etc.) usable by the designer 5. In other embodiments, computer system 108 comprises one or more network servers accessible by the designer 5 via a network connection (e.g., an Internet connection) formed between devices 106A, 106B and computer system 108. In still other embodiments, computer system 108 may comprise one or more virtual servers in a cloud computing environment.

In some embodiments, the designer 5 defines a domain, such as a 3D domain, to be partitioned using devices 106A, 106B. For example, the designer 5 may select one domain from a plurality of domains (indicated schematically at box 107A of FIG. 7) stored on the memory of computer system 108. Alternatively, the designer 5 may construct or draw the domain herself using input device 106A. Additionally, in some embodiments, the designer 5 defines a Voronoi site geometry for a plurality of Voronoi sites and defines a special arrangement of the plurality of Voronoi sites. For example, the designer 5 may select a Voronoi site geometry from a plurality of Voronoi site geometries (indicated schematically at box 107B of FIG. 7) stored on the memory of computer system 108, and may also select a Voronoi site spatial arrangement or symmetry from a plurality of Voronoi site arrangements stored on the memory of computer system 108. Alternatively, the designer 5 may manually construct or draw the Voronoi site geometry as well as manually arrange the plurality of Voronoi sites within the predefined domain using devices 106A, 106B.

In some embodiments, the computer system 108 receives the domain, Voronoi site geometry, and Voronoi site spatial arrangement defined by the designer 5 as a set of inputs from which the computer system 108, and performs partitive solid geometry on the received set of inputs to produce an output that includes a space-filling solid model (indicated at box 109 of FIG. 7) that may be displayed to the designer 5 via the display device 106B. In this manner, the computer system 108 may execute a forward design strategy using partitive solid geometry to create a space-filling solid model.

Alternatively, or in addition to, the domain, the Voronoi site geometry, and Voronoi site spatial arrangement, the designer 5 may also input to the computer system 108 via devices 106A, 106B one or more desired behaviors for the space-filling solid model created by the computer system 108. For example, the designer 5 may input one or more preferred mechanical properties (e.g., rigidity, strength, etc.) to the computer system 108 and the computer system 108 may create the space-filling solid model in accordance with the one or more preferred mechanical properties provided by the designer 5. In some embodiments, computer system 108 may optimize one or more of the domain geometry, Voronoi site geometry, and/or Voronoi site spatial arrangement defined by the designer 5 and inputted to the computer system 108 in order to more perfectly achieve one or more preferred behavioral inputs also defined by the designer 5. In other words, computer system 108 may be configured to optimize the design provided by the designer 5.

Alternatively, computer system 108 may be configured to create a space-filling model solid model based only on one or more desired behaviors or features of the space-filling solid model inputted to the computer system 108 by the designer 5. Thus, computer system 108 may define a domain geometry, a Voronoi site geometry, and/or a Voronoi site spatial arrangement or symmetry based on the desired behaviors for the space-filling solid model provided by the designer 5 to the computer system 108. In this manner, the computer system 108 may execute an inverse design strategy using partitive solid geometry to create a space-filling solid model.

Figure 8:
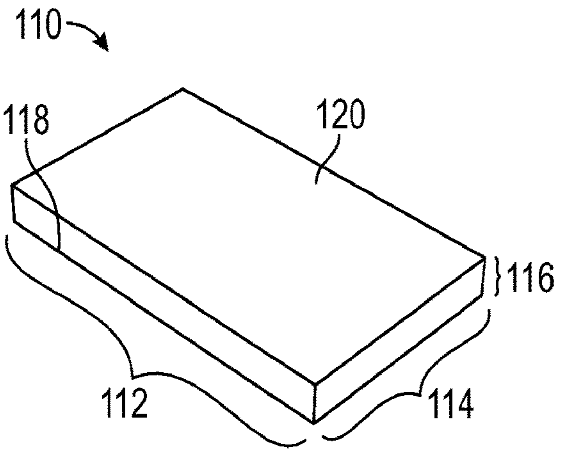
FIGS. 8-12 are perspective views of domains partitionable by the method of FIG. 1 according to some embodiments.
Figure 9:
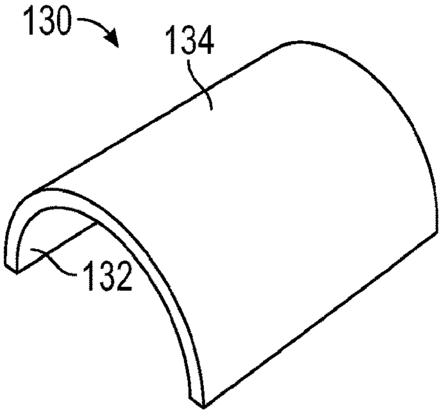
Figure 10:
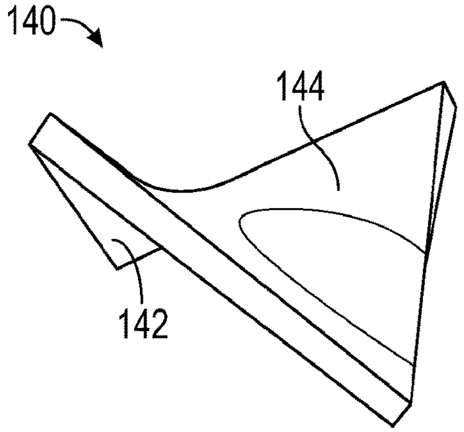

Referring now to FIGS. 8-12, various embodiments of exemplary domains to be partitioned are shown. As described above, a domain to be partitioned using the method 10 shown in FIG. 1 and described above may vary in geometry. For example, FIGS. 8-10 illustrate exemplary thin-walled domains 110, 130, and 140, respectively. Domain 110 generally includes a thin-walled rectangular shell having a length 112 and a width 114 that are each substantially greater in magnitude than a height 116 of the domain 110. As with domain 30 shown in FIG. 2, domain 110 includes a first or lower end 118 defined by a lower planar surface and a second or upper end 120 defined by an upper planar surface. Conversely, domain 130, which also includes a thin-walled shell, includes a first or lower end 132 defined by a concave curved surface and a second or upper end 134 defined by a convex curved surface. Thus, domain 130 is semi-cylindrical in shape compared to the planar geometry of domain 110. Additionally, domain 140 includes a thin-walled shell or envelope having a first or lower end 142 defined by a saddle-shaped surface that is both convex and concave, and a second or upper end 144 defined by a saddle-shaped surface that is also both convex and concave.

Figure 11:
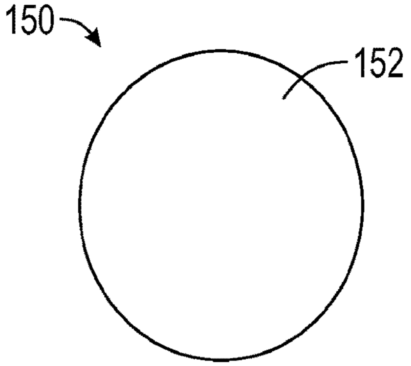
Figure 12:
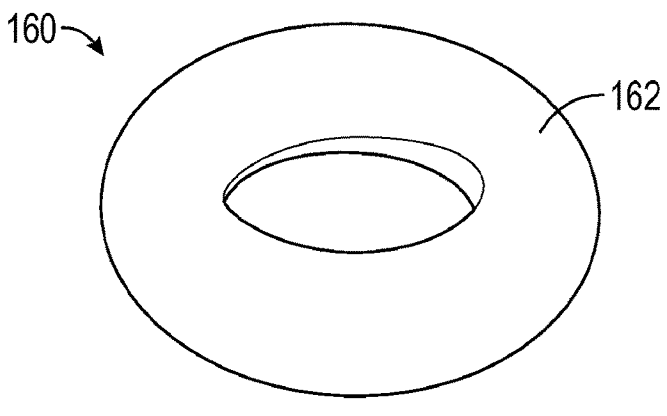

FIGS. 11 and 12 illustrate exemplary 3D domains 150, 160, respectively, which differ from the 3D domain shown in FIG. 2. Particularly, domain 150 shown in FIG. 11 includes a topological sphere defined by a spherical external surface 152 while domain 160 shown in FIG. 12 includes a topological toroid defined by a toroidal external surface 162. It should be appreciated that 2D, 2.5D, and 3D domains can be partitioned to create space-filling models using method 10 that differ from domain 30 shown in FIG. 2 and the exemplary domains 110, 130, 140, 150, and 160 shown in FIGS. 8-12, respectively.

Figure 13:
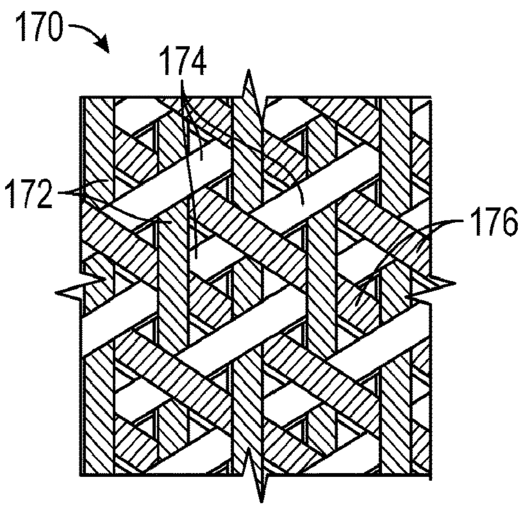
FIGS. 13-18 are schematic views of spatial arrangements of Voronoi sites according to some embodiments.
Figure 14:
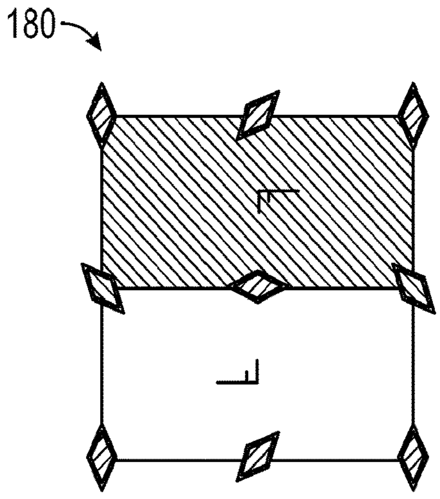
Figure 15:
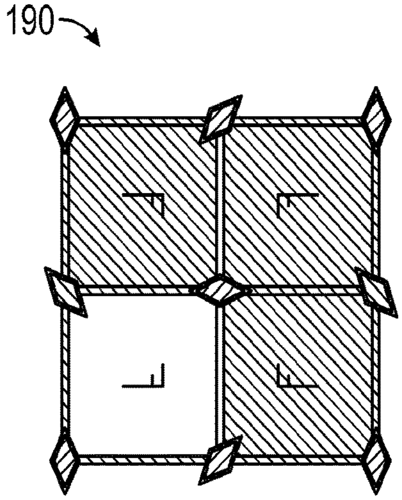
Figure 16:
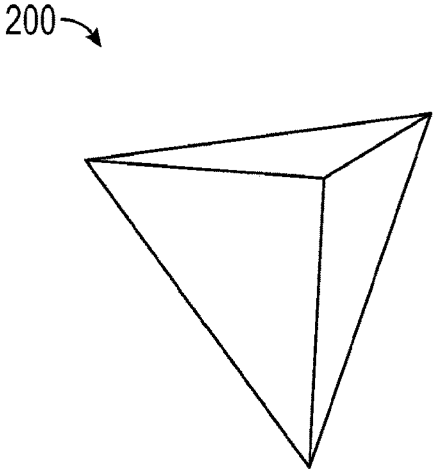
Figure 17:
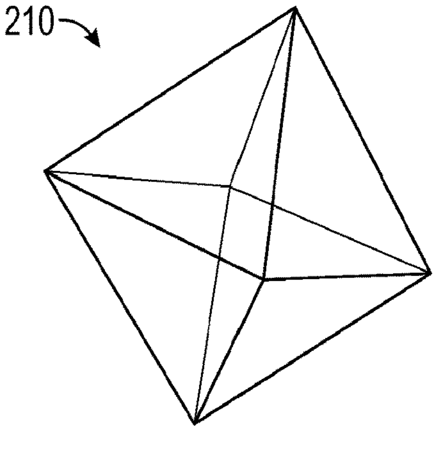
Figure 18:
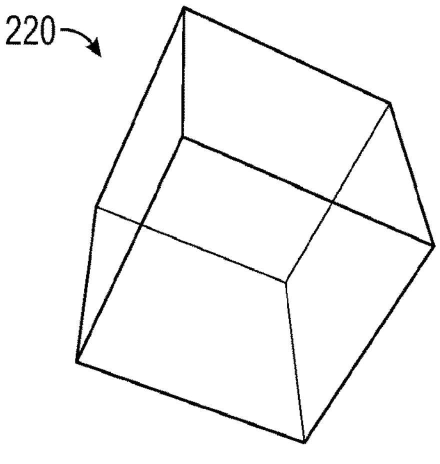

Referring now to FIGS. 13-18, various embodiments of spatial arrangements of Voronoi sites are shown. For example, FIGS. 13-15 illustrate 2D or 2.5D spatial arrangements 170, 180, and 190, respectively. Spatial arrangement 170 includes a woven or knotted arrangement including Voronoi sites disposed in three separate orientations 172, 174, and 176 (only some of which are labeled in FIG. 13 for clarity). Additionally, spatial arrangements 180, 190 illustrate different wallpaper symmetries of Voronoi sites. In some embodiments, wallpaper symmetries illustrated in the spatial arrangements 180, 190 may not necessarily include alternating patterns of differently oriented Voronoi sites as with the spatial arrangement 70 shown in FIG. 4. Instead, for example, a wallpaper symmetry may include a first row of Voronoi sites of a first orientation, a second row adjacent to the first row and including Voronoi sites of a second orientation, and a third row adjacent to the first row and including Voronoi sites of the first orientation. FIGS. 16-18 illustrate 3D spatial arrangements 200, 210, and 220, respectively. Particularly, spatial arrangements 200, 210, and 220 include differing polyhedral spatial arrangements or symmetries of a plurality of Voronoi sites to be positioned in a 3D domain.

Figure 19:
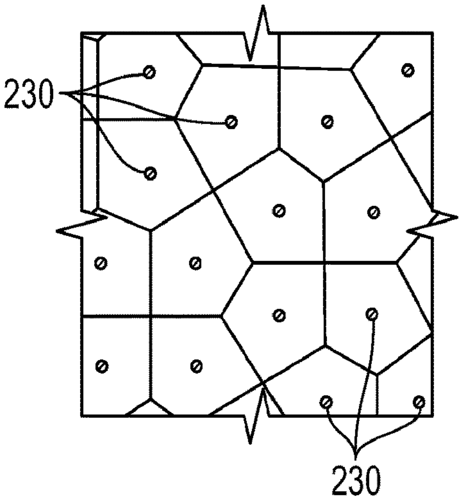
FIGS. 19 and 20 are schematic views of Voronoi sites according to some embodiments.
Figure 20:
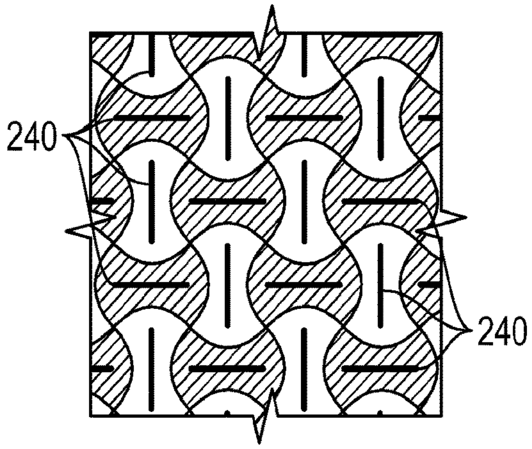
Figure 21:
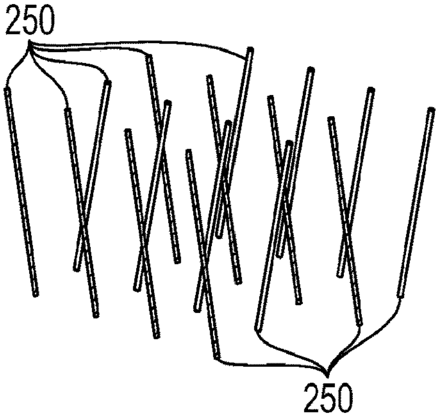
FIGS. 21-24 are perspective views of Voronoi sites according to some embodiments.

Referring now to FIGS. 19-24, various embodiments of Voronoi site geometries to be arranged in a predefined domain are shown. As described above, the geometry of Voronoi sites may vary from the Voronoi sites 50 shown in FIG. 3. For example, FIG. 19 illustrates a plurality of Voronoi sites 230 (only some of which are labeled in FIG. 18 in the interest of clarity) including points positioned along a 2D plane in a wallpaper spatial arrangement. FIG. 20 illustrates a plurality of Voronoi sites 240 (only some of which are labeled in FIG. 20 in the interest of clarity) including straight lines extending in either the X dimension or the Y dimension (depending on the orientation of the Voronoi site), the Voronoi sites 240 also being arranged in a plain weave symmetry or arrangement. FIG. 21 illustrates a plurality of Voronoi sites 250 (only some of which are labeled in FIG. 20 in the interest of clarity) including straight lines that extend in both the X dimension and in the Z dimension between a lower end and an upper end of a 3D domain in which the Voronoi sites 250 are positioned. In this embodiment, the Voronoi sites 250 are also positioned in a wallpaper arrangement.

Figure 22:
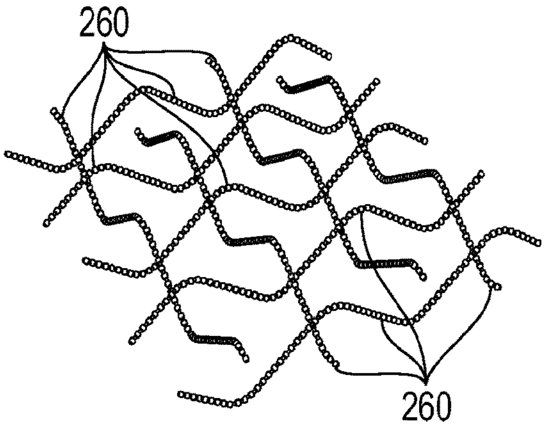
Figure 23:
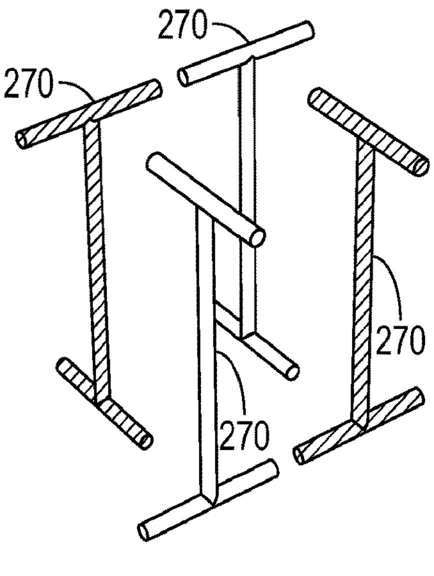
Figure 24:
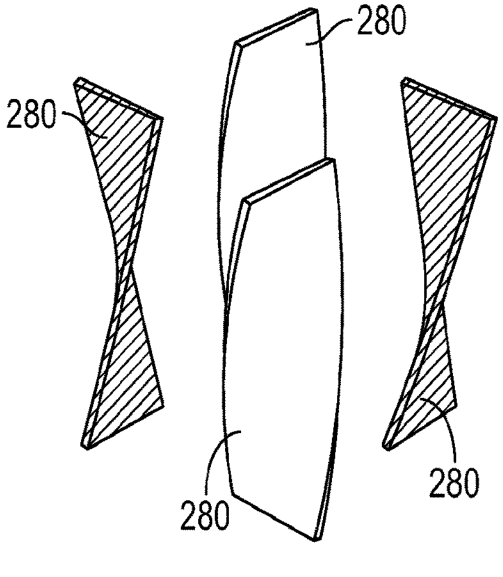

FIG. 22 illustrates a plurality of Voronoi sites 260 including curved or weave lines extending in both the Z dimension and the X or Y dimension depending on the orientation of the particular Voronoi site 260. Voronoi sites 260 may extend entirely between lower and upper ends as well as entirely between opposing lateral sides of a 3D domain in which the Voronoi sites 260 are arranged. FIG. 23 illustrates a plurality of Voronoi sites 270 that are complex and linear. Voronoi sites 270 may have some similarity to Voronoi sites 50 shown in FIG. 3 except that instead of being V-shaped, Voronoi sites 270 include a pair of opposing T-shape ends. The Voronoi sites 270 shown in FIG. 23 are disposed in a weave spatial arrangement. Further, FIG. 24 illustrates a plurality of Voronoi sites 280 including 3D surfaces extending entirely between a lower end and an upper end of a 3D domain in which the Voronoi sites 280 are arranged.

The various exemplary domains shown in FIGS. 8-12, spatial arrangements shown in FIGS. 13-18, and Voronoi site geometries shown in FIGS. 19-24 include distinct inputs employable by the method 10 shown in FIG. 1, and which may be combined in different permutations to create different space-filling models having widely varying physical properties useful in a wide variety of different applications. Thus, the single method 10 shown in FIG. 1 may be used by a designer to create an unlimited number of distinct space-filling models by varying the different inputs (e.g., domain configuration, spatial arrangement or symmetry, Voronoi site geometry, etc.) used by method 10 to create the space-filling model.

Figure 25:
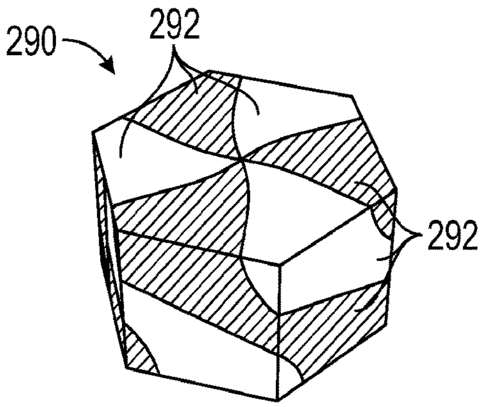
FIG. 25 is a perspective view of another space-filling solid model according to some embodiments.
Figure 26:
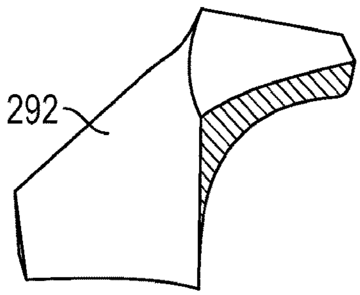
FIG. 26 is a perspective view of a tile of the space-filling solid model of FIG. 25 according to some embodiments.
Figure 27:
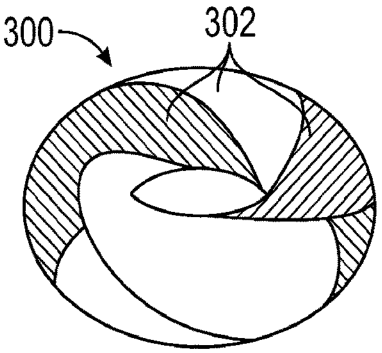
FIG. 27 is a perspective view of another space-filling solid model according to some embodiments.
Figure 28:
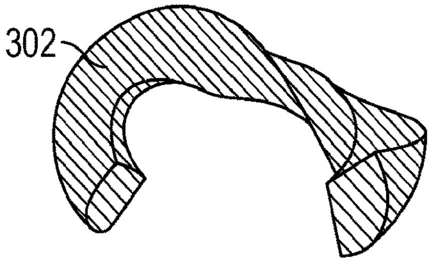
FIG. 28 is a perspective view of a tile of the space-filling solid model of FIG. 27 according to some embodiments.
Figure 29:
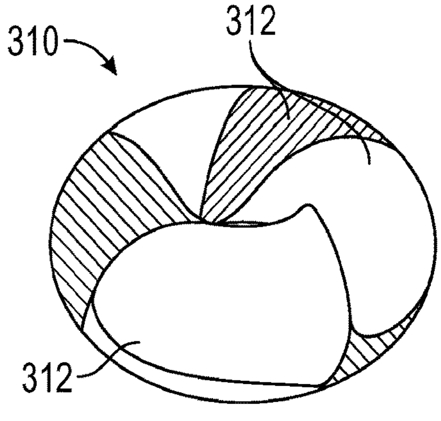
FIG. 29 is a perspective view of another space-filling solid model according to some embodiments.
Figure 30:
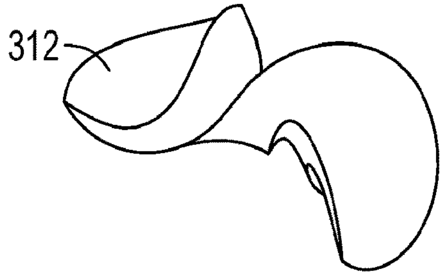
FIG. 30 is a perspective view of a tile of the space-filling solid model of FIG. 29 according to some embodiments.

Referring now to FIGS. 25-36, various embodiments of space-filling models creatable through the use of method 10 of FIG. 1 are shown. As described above, the configuration of the space-filling models creatable by method 10 may vary from that of the space-filling model shown in FIG. 6. For example, FIGS. 25 and 26 illustrate a prismatic cylindrical space-filling model 290 including a plurality of parts 292. Each part 292 of space-filling model 290 may be formed from a linear Voronoi site, and particularly, a rectilinear Voronoi site including a straight line. FIGS. 27, 28 illustrate a toroidal space-filling model 300 including a plurality of parts 302. Each part 302 of space-filling model 300 may be formed from a curved Voronoi site, and particularly, a Voronoi site including a twisted curve. FIGS. 29 and 30 similarly illustrate a toroidal space-filling model 310 including a plurality of parts 312 that differ in shape from the parts 302 comprising the space-filling model 300. Each part 312 of space-filling model 310 may be formed from a Voronoi site including a twisted curve.

Figure 31:
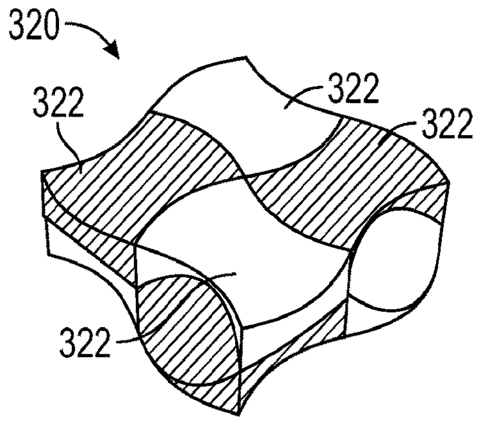
FIG. 31 is a perspective view of another space-filling solid model according to some embodiments.
Figure 32:
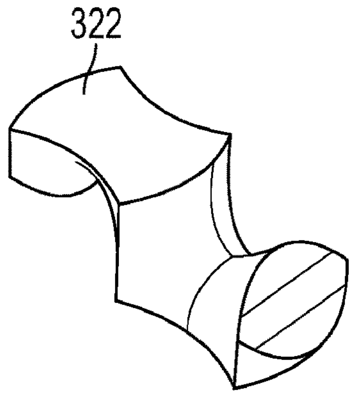
FIG. 32 is a perspective view of a tile of the space-filling solid model of FIG. 31 according to some embodiments.
Figure 33:
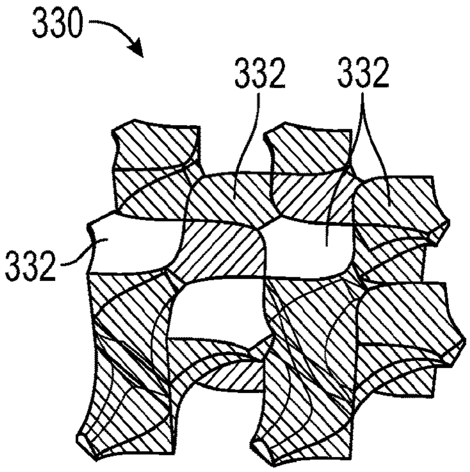
FIG. 33 is a perspective view of another space-filling solid model according to some embodiments.
Figure 34:
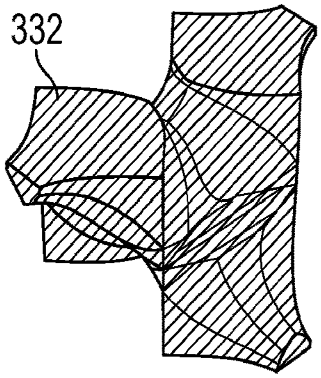
FIG. 34 is a perspective view of a tile of the space-filling solid model of FIG. 33 according to some embodiments.
Figure 35:
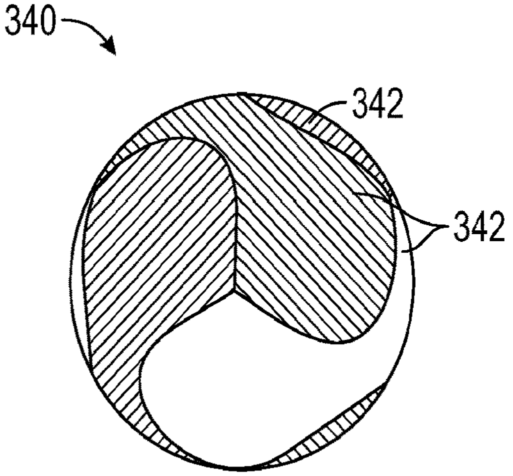
FIG. 35 is a perspective view of another space-filling solid model according to some embodiments.
Figure 36:
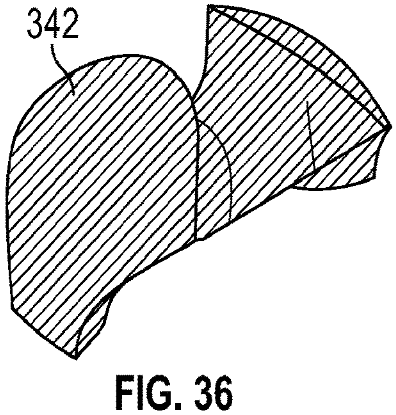
FIG. 36 is a perspective view of a tile of the space-filling solid model of FIG. 35 according to some embodiments.

FIGS. 31, 32 illustrate a space-filling model 320 including a plurality of parts 322. Space-filling model 320 may comprise a flat or planar sheet and parts 322 of model 320 may be formed from Voronoi sites including woven curves. FIGS. 33, 34 illustrate a space-filling model 330 including a plurality of parts 332, where model 330 also comprise a flat or planar sheet. Parts 332 are formed from Voronoi sites including woven curves which are different in shape than the Voronoi sites from which the parts 322 of space-filling shape 320 is formed. FIGS. 35, 36 illustrate a spherical space-filling model 340 including a plurality of parts 342. Each part 342 of space-filling model 340 may be formed from a Voronoi site including a polyhedron.

Figure 37:
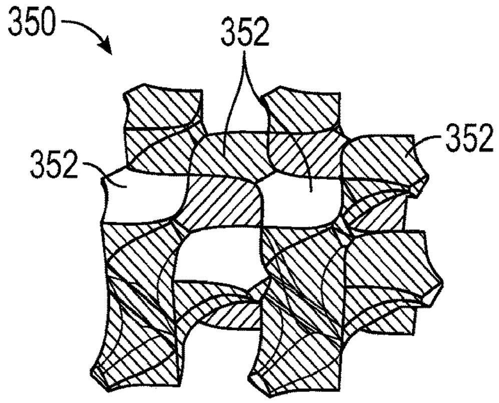
FIGS. 37-41 are perspective views of space-filling structures according to some embodiments.
Figure 38:
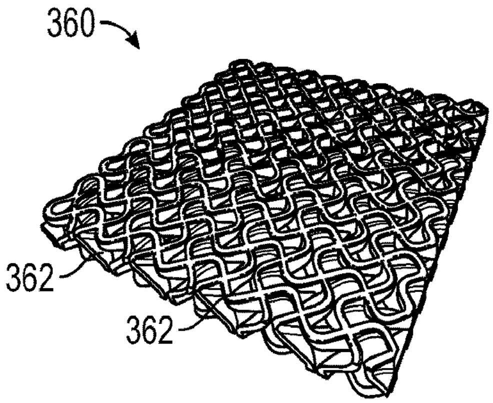

Referring to FIGS. 37-41, space-filling models created using the steps of method 10 shown in FIG. 1 can be used to create physical structures have a variety of shapes and physical properties, depending on the particular inputs (e.g., geometry of the domain, geometry of the Voronoi sites, spatial arrangement of the Voronoi sites, etc.). For example, FIG. 37 illustrates a brick-shaped structure 350 comprised of a plurality of repeating and interlocking tiles 352 disposed in two separate orientations relative to the Z-dimension. In some embodiments, structure 350 is formed using an additive manufacturing process based on the space-filling model 330 shown in FIGS. 33 and 34. FIG. 38 illustrates a foam-like structure 360 comprised of a plurality of repeating and interlocking cellular structures 362 (only some of which are labeled in FIG. 38 in the interest of clarity). The brick-like and foam-like structures 350, 360 could be used in a variety of applications such as for thermal insulation or as an energy absorbing structure used to protect a cargo shielded by the structures 350, 360.

Figure 39:
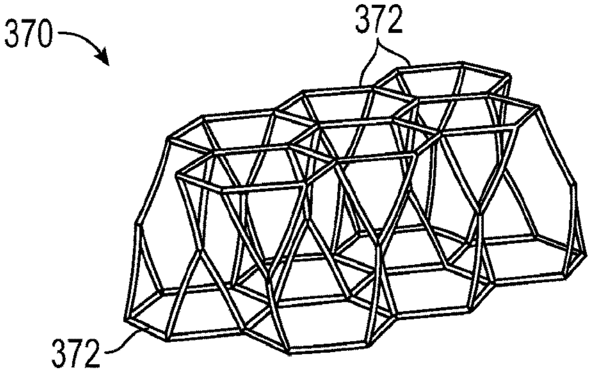
Figure 40:
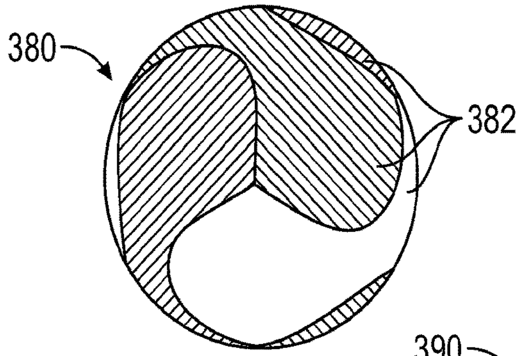

FIG. 39 illustrates a truss 370 formable (e.g., using an additive manufacturing process) from a space-filling model that may be created using method 10 shown in FIG. 1. Truss 370 is comprised of a plurality of frames 372 that are coupled together to form truss 370. In some embodiments, truss 370 is created using a Delaunay Lofts algorithm as will be discussed further herein. Truss 370 can be used as a load bearing structure in aerospace and/or architectural applications. FIG. 40 illustrates a physical puzzle 380 also creatable using method 10 shown in FIG. 1 and that is comprised of a plurality of puzzle pieces 382. In some embodiments, puzzle 380 is formed using an additive manufacturing process based on the space-filling model 340 shown in FIGS. 35, 36. Puzzles, such as puzzle 380, creatable using the method 10 shown in FIG. 1 may, in addition to providing entertainment to a user, may also serve to teach the user basic principles of geometry, and to develop the spatial reasoning ability of the user through hands-on and playful design and prototyping activities.

Figure 41:
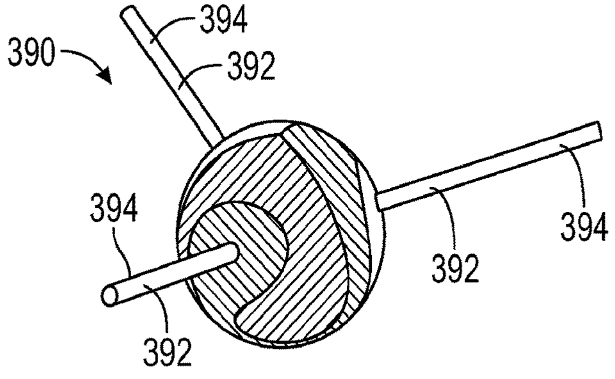

FIG. 41 illustrates a connector 390 formable (e.g., using an additive manufacturing process) from a space-filling model created using the method 10 shown in FIG. 1, connector 390 including a plurality of interlocking parts 392. Particularly, connector 390 acts as a connector between three separate frames or cylinders 394, where each part 392 includes one of the cylinders 394. As will be discussed further herein, the parts 390 of connector 390 may be geometrically interlocked such that connector 390 is configured to resist decoupling even in response to high loads being applied to cylinders 394. Connectors, such as connector 390 may be used to connect frames to form trusses or other load bearing structures.

As described above, method 10 of FIG. 1 may be employed to create a wide variety of space-filling shapes, including special classes of shapes a few examples of which are discussed further herein. Referring to FIGS. 21 and 42-47, an exemplary process for creating a hexagonal Delaunay Loft 430 is shown. Block 20 of method 10 shown in FIG. 1 may include simplifying a 3D domain containing a plurality of Voronoi sites into a plurality of stacked planar layers, each planar layer containing a plurality of Voronoi sites in the form of points corresponding to the intersection of the Voronoi sites with the particular layer. The layers may be decomposed using Voronoi partitioning and the resulting decomposed layers may be interpolated layer-by-layer to form a 3D space-filling shape, where Delaunay Lofts comprise one example of a space-filling shape creatable through such a process.

Figure 42:
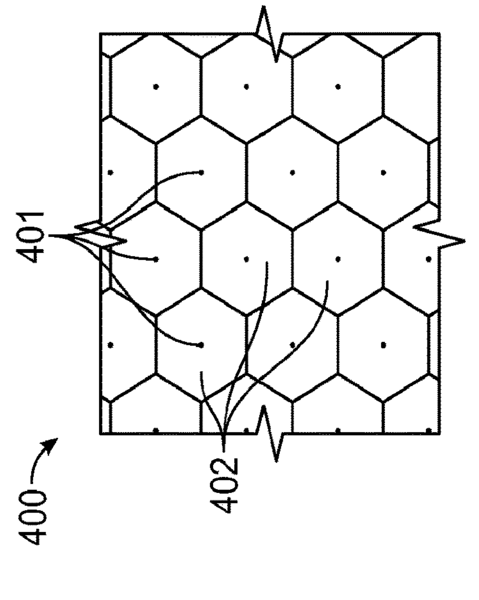
FIG. 42 is a schematic view of a bottom layer of another 3D domain of a space-filling solid model according to some embodiments.
Figure 43:
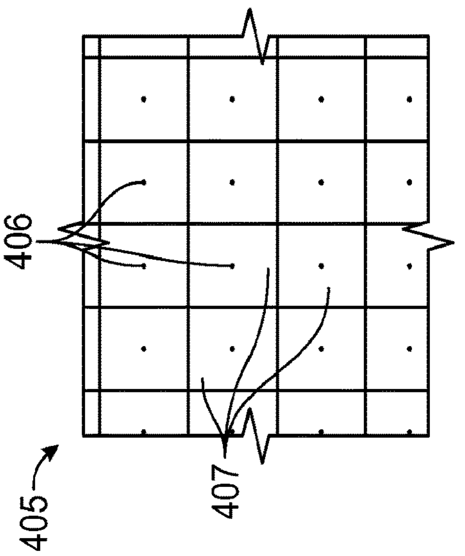
FIG. 43 is a schematic view of an intermediate layer of the 3D domain of FIG. 42 according to some embodiments.
Figure 44:
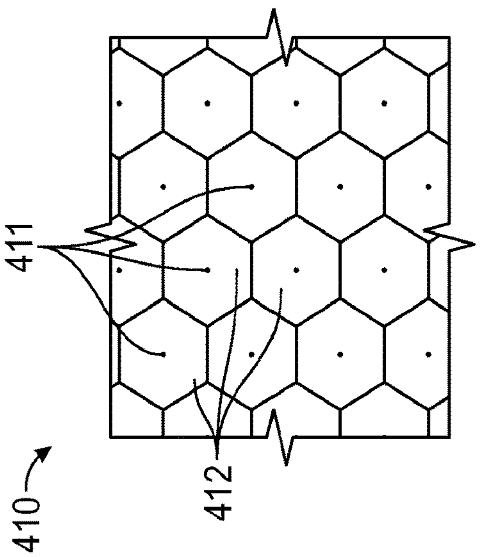
FIG. 44 is a schematic view of a top layer of the 3D domain of FIG. 42 according to some embodiments.
Figure 45:
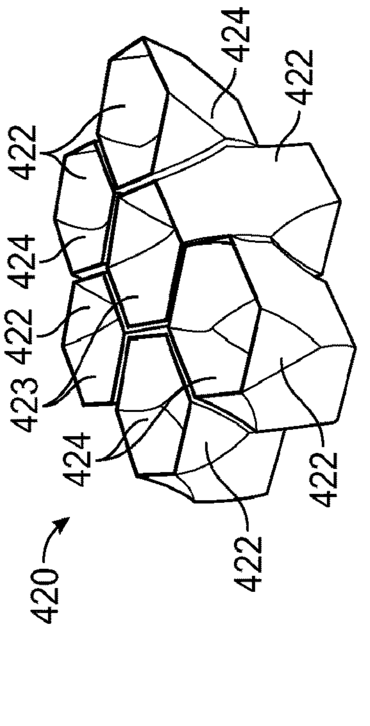
FIG. 45 is a perspective view of the space-filling solid model of FIG. 42 according to some embodiments.
Figure 46:
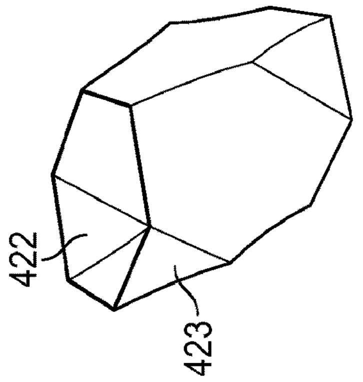
FIG. 46 is a perspective view of a tile of the space-filling solid model of FIG. 42 according to some embodiments.
Figure 47:
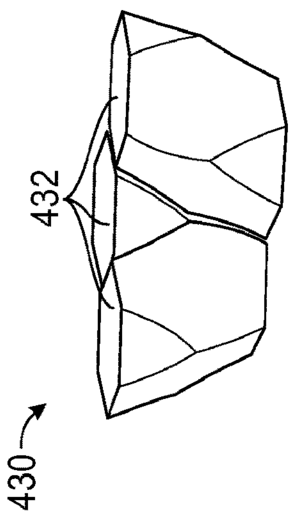
FIG. 47 is a perspective view of a space-filling solid structure created from the space-filling solid model of FIG. 42 according to some embodiments.

In the embodiment of FIGS. 21 and 42-47, Delaunay Loft 430 is created based on a space-filling Delaunay Loft model 420 including a plurality of interlocking parts 422. Parts 422 are each formed from and correspond to one of the linear Voronoi sites 250 shown in FIG. 21, the Voronoi sites 250 being spatially arranged according to wallpaper symmetries. FIG. 42 illustrates a first or bottom planar layer 400 (e.g., a bottom layer extending in the X and Y dimensions) of a 3D domain; FIG. 43 illustrates one exemplary intermediate planar layer 405 of a plurality of sampled intermediate planar layers of the 3D domain; and FIG. 44 illustrates a top planar layer 410 of the 3D domain.

Layers 400, 405, 410 illustrate the points 401, 406, and 411 (only some of which are labeled in FIGS. 42-44 in the interest of clarity), respectively, of the Voronoi sites 250 that intersect the layers 400, 405, and 410. Given that Voronoi sites 250 each extend three-dimensionally, points 406 of intermediate layer 405 are shifted or translated with respect to both the points 401 of bottom layer 400 and the points 411 of top layer 410. FIGS. 42-44 illustrate layers 400, 405, 410 following their Voronoi partitioning as determined by a selected distance function, and thus, each illustrates a plurality of 2D planar tiles 402, 407, and 412 (only some of which are labeled in FIGS. 42-44 in the interest of clarity), respectively. Each tile 402 of bottom layer 400 contains exactly one point 401 (each point 401 including a Voronoi site of the bottom layer 400). Similarly, each tile 407 of intermediate layer 405 contains exactly one point 406 (each point 406 including a Voronoi site of the intermediate layer 405) and each tile 412 of upper tile 412 contains exactly one point 411 (each point 411 including a Voronoi site of the top layer 410) of top layer 410.

Given that Voronoi sites 250 extend three-dimensionally, the tiles 402 of bottom layer 400 are translated relative to the tiles 412 of top layer 410. Additionally, Voronoi sites 250 are arranged such that the tiles 402 of bottom layer 400 and the tiles 412 of top layer 400 are each hexagonal in shape. However, the tiles 407 of intermediate layer 405 are square in shape, and thus, topologically different from the tiles 402 of bottom layer 400 and the tiles 412 of top layer 410. Thus, tiles 402, 407, and 412 illustrate the topological changes that may occur along the length of a given 3D part 422 of Delaunay Loft model 420. Once each successive 2D layer of the 3D domain containing Voronoi sites 250 has been decomposed using Voronoi partitioning, the decomposed layers may be interpolated layer-by-layer to form the parts 422 of Delaunay loft model 420. The parts 422 of Delaunay Loft model 420 may be of the same shape but a first plurality of the parts 422 may be oriented in a first orientation 423, while a second plurality of the parts 422 may be oriented in a second orientation 423 that is shifted from the first orientation 423 respective to the Z-dimension to thereby form a topologically interlocking pattern including the Delaunay Loft model 420. The space-filling, physical Delaunay Loft 430 shown in FIG. 47, including a plurality of topologically interlocking parts 432, may be formed (e.g., through an additive manufacturing process) using the Delaunay Loft model 420 shown in FIG. 45.

Referring now to FIGS. 21 and 48-53, another exemplary process for forming another Delaunay Loft 470 is shown. Delaunay Loft 470 is created based on a space-filling Delaunay Loft model 460 including a plurality of interlocking 3D parts 462. Parts 462 are each formed from and correspond to one of the linear Voronoi sites 250 shown in FIG. 21, the Voronoi sites 250 being spatially arranged according to wallpaper symmetries. While the Voronoi sites 250 used to create the Delaunay Loft model 420 shown in FIG. 45 and the Delaunay Loft model 460 shown in FIG. 51 may each be arranged according to wallpaper symmetries, the particular symmetries of model 420 may vary from those of model 460, resulting in the parts 462 of Delaunay Loft model 460 having a pentagonal cross-section at some points along their respective lengths.

Figure 48:
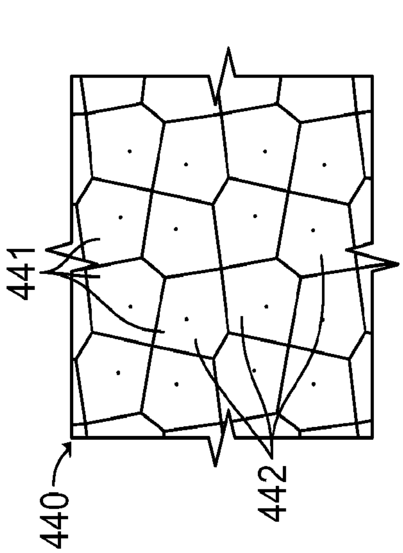
FIG. 48 is a schematic view of a bottom layer of another 3D domain of a space-filling solid model according to some embodiments.
Figure 49:
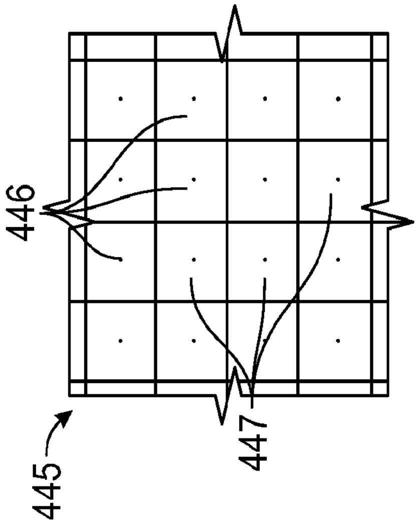
FIG. 49 is a schematic view of an intermediate layer of the 3D domain of FIG. 48 according to some embodiments.
Figure 50:
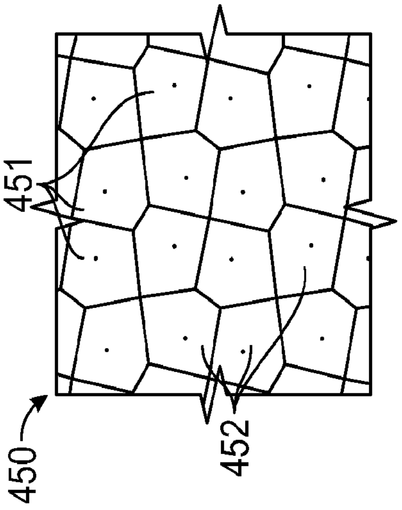
FIG. 50 is a schematic view of a top layer of the 3D domain of FIG. 48 according to some embodiments.
Figure 51:
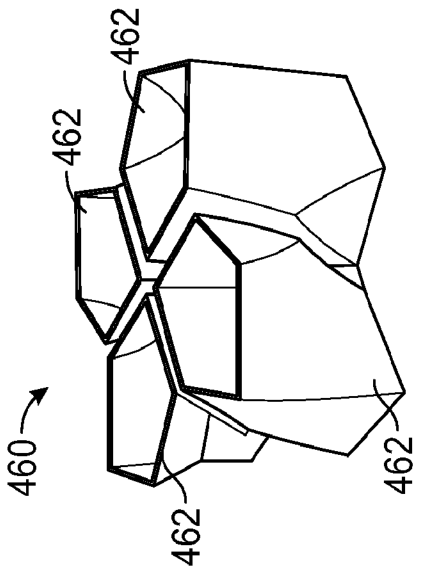
FIG. 51 is a perspective view of the space-filling solid model of FIG. 48 according to some embodiments.
Figure 52:
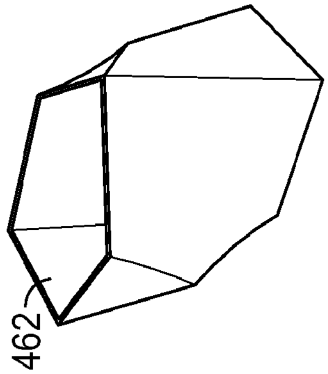
FIG. 52 is a perspective view of a tile of the space-filling solid model of FIG. 48 according to some embodiments.
Figure 53:
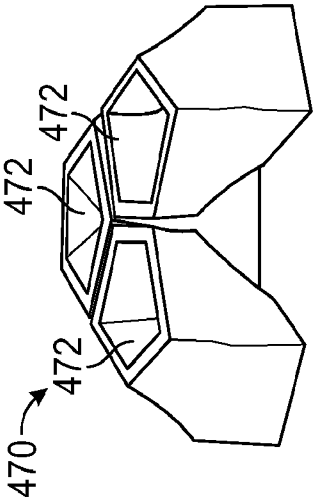
FIG. 53 is a perspective view of a space-filling solid structure created from the space-filling solid model of FIG. 48 according to some embodiments.

FIG. 48 illustrates a first or bottom planar layer 440 of a 3D domain; FIG. 49 illustrates one exemplary intermediate planar layer 445 of a plurality of sampled intermediate planar layers of the 3D domain; and FIG. 50 illustrates a top planar layer 450 of the 3D domain. Layers 440, 445, 450 illustrate the points 441, 446, and 451 (only some of which are labeled in FIGS. 48-50 in the interest of clarity), respectively, of the Voronoi sites 250 that intersect the layers 440, 445, and 450. Additionally, FIGS. 48-50 illustrate layers 440, 445, 450 following their Voronoi partitioning as determined by a selected distance function, and thus, each illustrates a plurality of 2D planar tiles 442, 447, and 452 (only some of which are labeled in FIGS. 48-50 in the interest of clarity), respectively.

Given that Voronoi sites 250 extend three-dimensionally, the tiles 442 of bottom layer 440 are translated relative to the tiles 452 of top layer 450. Additionally, Voronoi sites 250 are arranged such that the tiles 442 of bottom layer 440 and the tiles 452 of top layer 400 are each pentagonal in shape. However, the tiles 447 of intermediate layer 445 are square in shape and thus topologically different from the tiles 442 of bottom layer 440 and the tiles 452 of top layer 450. Similar to the creation of Delaunay Loft model 420 shown in FIG. 45, once each successive 2D layer (e.g., layers 440, 445, and 450) of the 3D domain containing Voronoi sites 250 has been decomposed using Voronoi partitioning, the decomposed layers may be interpolated layer-by-layer to form the parts 462 of Delaunay loft model 460. The parts 462 of Delaunay Loft model 460 may be of the same shape but a first plurality of the parts 462 may be oriented in a first orientation while a second plurality of the parts may be oriented in a second orientation that is shifted from the first orientation respective to the Z-dimension to thereby form a topologically interlocking pattern including the Delaunay Loft model 460. The space-filling, physical Delaunay Loft 470 shown in FIG. 53, including a plurality of topologically interlocking parts 472, may be formed (e.g., through an additive manufacturing process) using the Delaunay Loft model 460 shown in FIG. 51.

A second exemplary special class of shape that may be created using the method 10 shown in FIG. 1 are topologically interlocking parts. As used herein, the term "topologically interlocking" refers to tiles which interlock in a manner whereby an external retaining or coupling force must be applied to the topologically interlocking tiles to maintain the shape of the space-filling shape which includes the topologically interlocking tiles. In other words, a space-filling structure including topologically interlocking tiles will fall apart unless an externally applied retaining force is applied to the topologically interlocking tiles to main their positions within the space-filling structure.

One example of topologically interlocking parts are Generalized Abeille Tiles (GATs). GATs are generalizations of Abeille vaults and may be embodied in topologically interlocking tiles that provide high energy absorption and thus may be used to form impact-resistant materials such as protective gear. Additionally, space-filling structures including topologically interlocking tiles, such as GATs, are configured to localize displacement relative to other structures. For instance, given that space-filling structures including GATs form an entirely solid block, a displacement of a surface of a space-filling structure including topologically interlocking tiles in response to the application of an external force applied orthogonally against the surface may not result in globalized displacement of most or all of the space-filling structure, and instead will generally, relative to other structures (e.g., a box structure), be localized to the surface against which the force is applied.

Figure 54:
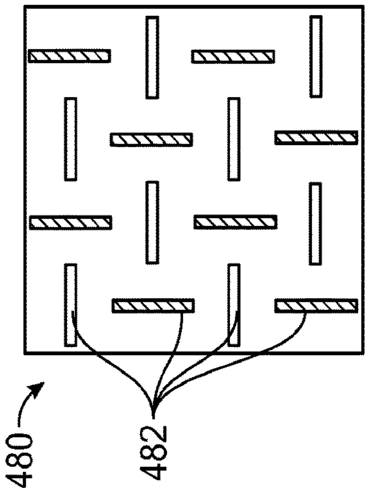
FIG. 54 is a schematic view of a bottom layer of the 3D domain of FIG. 3 according to some embodiments.
Figure 55:
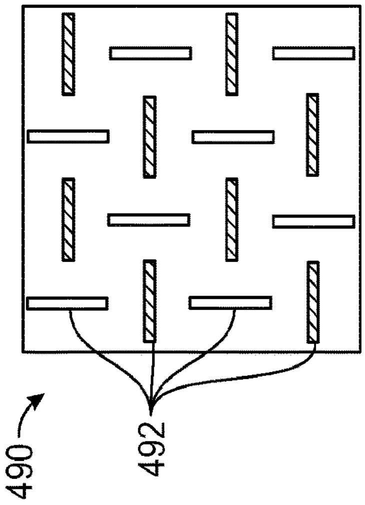
FIG. 55 is a schematic view of a top layer of the 3D domain of FIG. 3 according to some embodiments.

In some embodiments, space-filling model 100 may be created using a 3D generation algorithm. The 3D generation algorithm may generally include taking union of all Voronoi regions belonging to the same Voronoi site 50 to obtain the parts 101 as part of a set of face removal operations. For example, the shared faces of two consecutive convex polyhedral coming from two consecutive sample points on the curve formed between the two convex polyhedral are deleted. It should be understood these faces will always have the same verted position with opposing order. This operation may provide a 2-manifold mesh if underlying mesh data structure provides consistent information. Additionally, even if the underlying data structure does not provide consistent information, the operation creates a disconnected set of polygons that can still be fabricated through additive manufacturing Alternatively, topologically interlocking tiles, including some GATs may be created through a layer-by-layer interpolation approach whereby 3D domain 30 shown in FIG. 2 is divided into a plurality of 2D planar layers stacked along the Z-dimension. Particularly, referring to FIGS. 2-6, 54, and 55, an exemplary process for forming space-filling model 100 is shown, where the parts 101 of model 100 (described in further detail above) include GATs formed from Voronoi sites 50, which are arranged in a weave symmetry. In some embodiments, space-filling model 100 may be created FIG. 54 illustrates a bottom layer 480 corresponding to the lower end 38 of 3D domain 30 while FIG. 55 illustrates a top layer 490 corresponding to the upper end 40 of 3D domain 30.

Bottom layer 480 includes a plurality of line segments 482 (in two different orientations corresponding to orientations 62, 64 of Voronoi sites 50), each line segment 482 defined by the intersection of a pair of points of a Voronoi site 50 with the bottom layer 480. Similarly, top layer 490 includes a plurality of line segments 482 (in two different orientations corresponding to orientations 62, 64 of Voronoi sites 50), each line segment 482 defined by the intersection of a pair of points of a Voronoi site 50 with the bottom layer 480. In the interest of clarity, only some of the line segments 482 are labeled in FIG. 54 and only some of the line segments 492 are labeled in FIG. 55. Line segments 482 include the Voronoi sites 482 of bottom layer 480, while the line segments 492 include the Voronoi sites 490. Thus, layers 480, 490 may each be decomposed using Voronoi partitioning (along with a plurality of intermediate layers of 3D domain 30 that are not shown) based on the geometry and arrangement of line segments 482, 492, respectively. The decomposed planar layers of 3D domain, including layers 480, 490, may be interpolated layer-by-layer to form the parts 101 of space-filling model 100.

Figure 56:
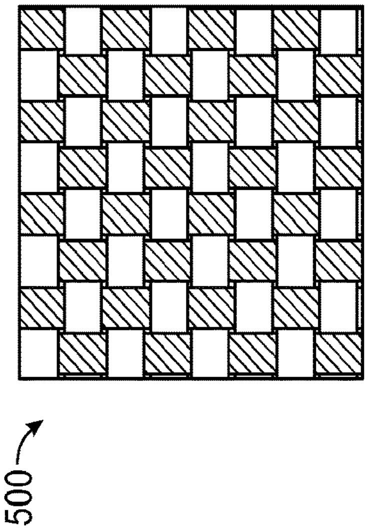
FIG. 56 is a schematic view of another spatial arrangement of Voronoi sites according to some embodiments.
Figure 57:
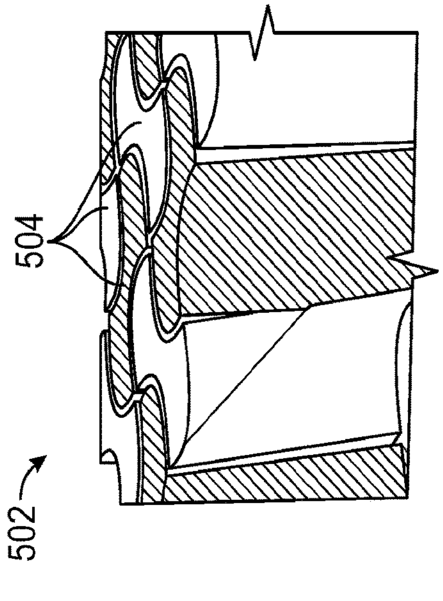
FIG. 57 is a partial perspective view of a space-filling structure created from the spatial arrangement of FIG. 56 according to some embodiments.
Figure 58:
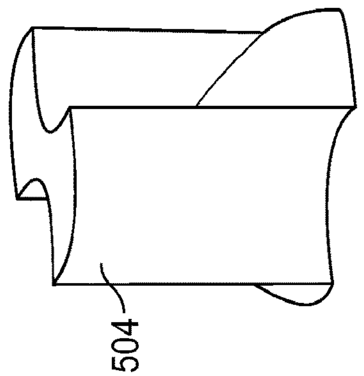
FIG. 58 is a perspective view of a tile of the space filling structure of FIG. 57 according to some embodiments.
Figure 59:
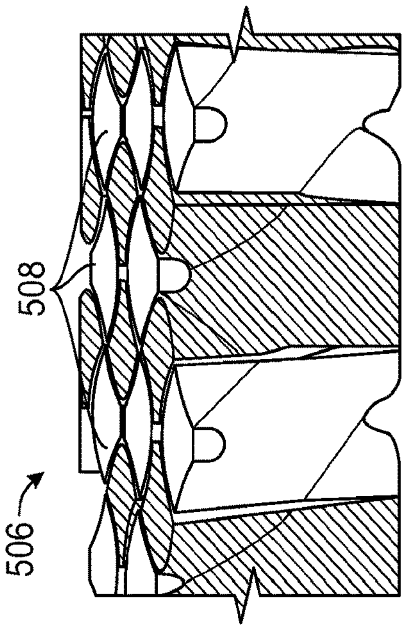
FIG. 59 is a partial perspective view of another space-filling structure created from the spatial arrangement of FIG. 56 according to some embodiments.
Figure 60:
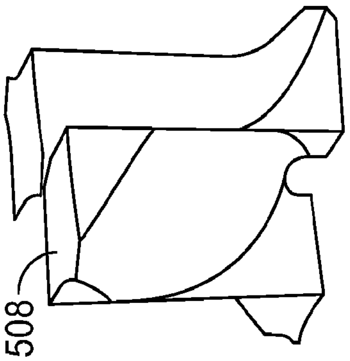
FIG. 60 is a perspective view of a tile of the space filling structure of FIG. 59 according to some embodiments.

Referring to FIGS. 56-65, other examples of space-filling models including GATs are shown. Particularly, FIG. 56 shows a plain weave spatial arrangement or symmetry 500 for which Voronoi sites (e.g., Voronoi sites 50 shown in FIG. 3) may be arranged to form GATs. FIGS. 57 and 58 illustrate a first space-filling model 502 based on the spatial arrangement 500 of FIG. 56 and including a plurality of GATs 504 that are topologically interlocked. FIGS. 59 and 60 illustrate a second space-filling model 506 based on the spatial arrangement 500 shown in FIG. 56 and including a plurality of GATs 508 that are topologically interlocked. The geometry of GATs 504 of space-filling model 502 differ from the geometry of GATs 508 of space-filling model 506, although each model 502, 506 is based on the same spatial arrangement 500. The difference in geometry between GATs 504, 508 may be due to a difference in geometry of the Voronoi sites from which GATs 504, 408 are formed. Thus, the difference in geometry of GATs 504, 508 illustrates how space-filling models may be flexibly tailored in response to changing a single input (Voronoi site geometry in this instance).

Figure 61:
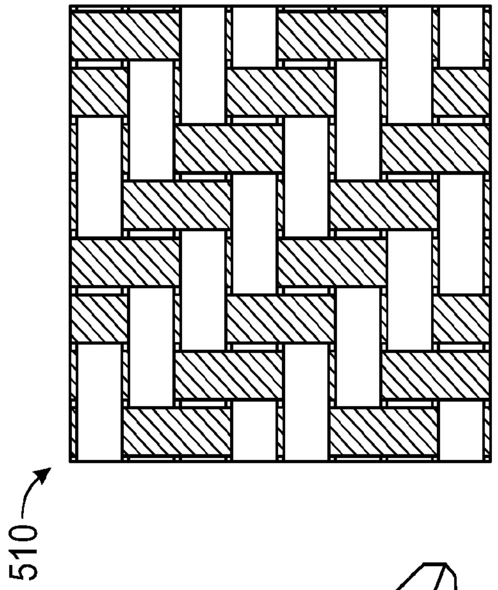
FIG. 61 is a schematic view of another spatial arrangement of Voronoi sites according to some embodiments.
Figure 62:
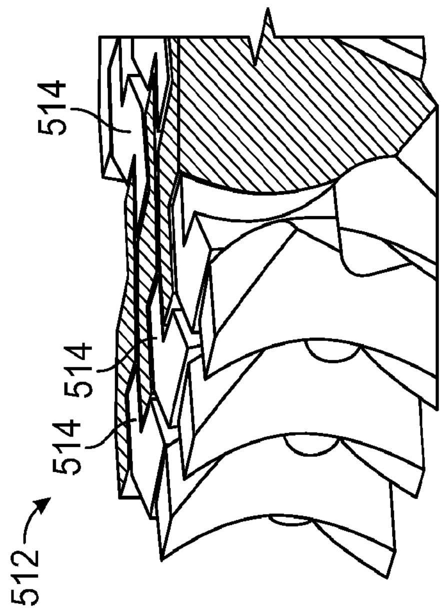
FIG. 62 is a partial perspective view of a space-filling structure created from the spatial arrangement of FIG. 61 according to some embodiments.
Figure 63:
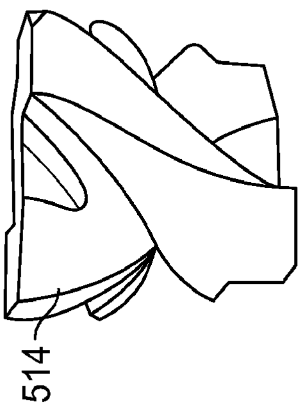
FIG. 63 is a perspective view of a tile of the space filling structure of FIG. 62 according to some embodiments.
Figure 64:
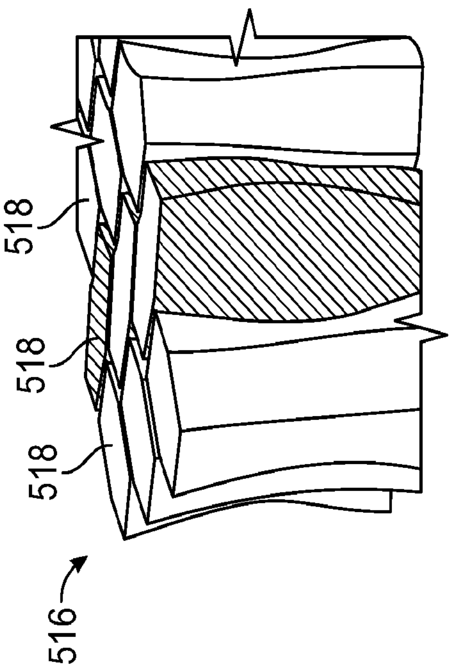
FIG. 64 is a partial perspective view of another space-filling structure created from the spatial arrangement of FIG. 61 according to some embodiments.
Figure 65:
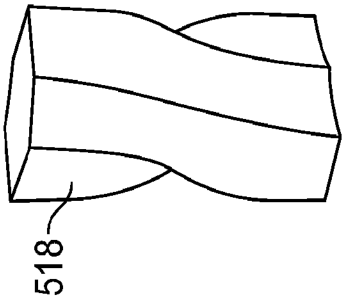
FIG. 65 is a perspective view of a tile of the space filling structure of FIG. 64 according to some embodiments.

FIG. 61 illustrates a twill weave spatial arrangement or symmetry 510 for which Voronoi sites (e.g., Voronoi sites 50 shown in FIG. 3) may be arranged to form GATs. FIGS. 62 and 63 illustrate a first space-filling model 512 based on the spatial arrangement 510 of FIG. 61 and including a plurality of GATs 514 which are topologically interlocked. FIGS. 64 and 65 illustrate a second space-filling model 516 based on the spatial arrangement 510 shown in FIG. 61 and including a plurality of GATs 518 that are topologically interlocked. The geometry of the Voronoi sites from which GATs 514, 518 are formed may differ from each other, resulting in the geometry of GATs 514 differing from the geometry of GATs 518.

A second exemplary special class of shape which may be created using the method 10 shown in FIG. 1 are geometrically interlocking tiles. As used herein, the term "geometrically interlocking tiles" may refer to tiles that are interlocked in such a manner that it is impossible to assemble them without applying at least one or more of the following operations: (1) lifting the tiles up into a higher dimensional space, (2) deforming at least one of the tiles (e.g., applying a non-rigid transformation), and (3) cutting at least one of the tiles into at least two or more pieces. To state in other words, "geometrically interlocking tiles" may refer herein to arrangements of tiles in which one or more of the tiles must be deformed or broken to either couple the tiles together or decouple the geometrically interlocking tiles from one another. Space-filling structures including geometrically interlocked tiles thus have high resistance to decoupling and may be used to form high-resiliency connectors, trusses, and other materials requiring high strength.

One example of geometrically interlocking tiles are woven tiles. Woven tiles may include geometrically interlocked tiles that have relatively high resistance to external forces. For example, in some embodiments, shape-filling structures comprised of geometrically locked, woven tiles or threads offer the potential to withstand a force approximately four orders of magnitude greater to cause mechanical failure compared to a monolithic block of an identical external shape and volume.

Figure 66:
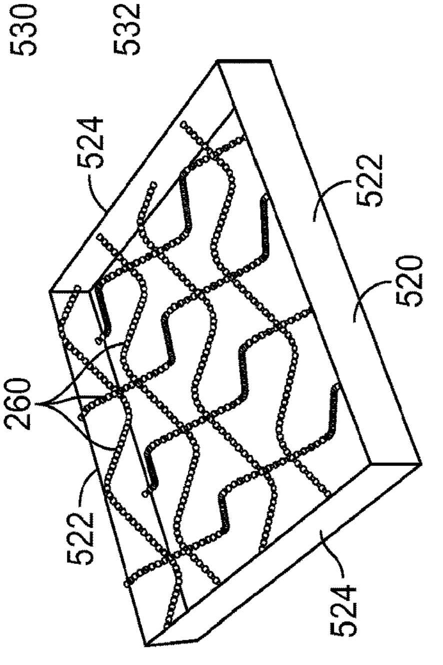
FIG. 66 is a perspective view of a plurality of Voronoi sites arranged in a 3D domain.
Figure 67:
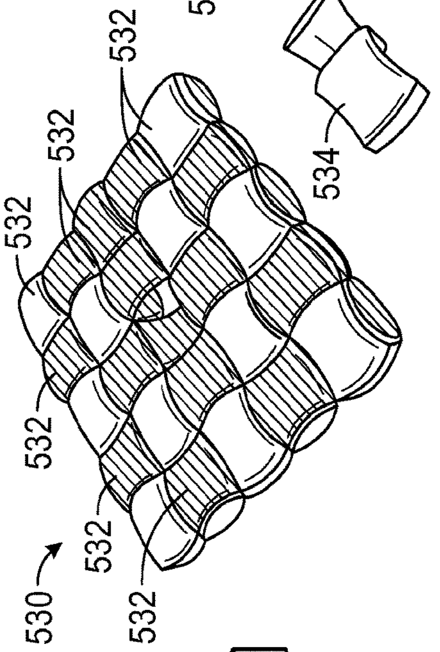
FIG. 67 is a perspective, partially-exploded view of a space-filling solid model created from the Voronoi sites and 3D domain of FIG. 66.

Referring to FIGS. 22, 66, and 67, an exemplary process for creating a space-filling model 530 is shown, the space-filling model 530 including a plurality of geometrically interlocked, woven tiles or threads 532. In some embodiments, woven tiles 532 are formed from the Voronoi sites 260 shown in FIG. 22 that include weave lines. Voronoi sites 260 may be arranged in a 3D domain 520 shown in FIG. 66, where each Voronoi site 260 (only some of which are labeled in FIG. 66 in the interest of clarity), extend either entirely between a first pair of opposing lateral ends 522 or a second pair of opposing lateral ends 524 of 3D domain 520, depending on the orientation of the particular Voronoi site 260. Thus, at least some of the Voronoi sites 260 may extend longitudinally in a first direction (e.g., in the X-dimension), while at least some other of the Voronoi sites 260 may extend longitudinally in a second direction (e.g., in the Y-dimension) that is orthogonal to the first direction. Similarly, at least some of the woven tiles 532 may extend longitudinally in a first direction (e.g., in the X-dimension) while at least some other of the woven tiles 532 may extend longitudinally in a second direction (e.g., in the Y-dimension) that is orthogonal to the first direction.

Geometrically interlocking tiles, including woven tiles (e.g., woven tiles 532), are formed using a 3D generation algorithm. In some exemplary embodiments, a 3D generation algorithm for creating geometrically interlocking tiles includes generating control curves (e.g., Voronoi sites) in a rectangular prism domain for a given weave symmetry, and mapping the rectangular prism domain onto a desired domain and applying the mapping to the original control curves. Additionally, the 3D generation algorithm includes, in some exemplary embodiments, sampling the control curves by obtaining the same number of points for reach curve segment, labeling the points that are originated from the same curve using the same label, decomposing the domain using 3D Voronoi sites of these points to provide a set of labeled Voronoi regions (comprising labeled convex polyhedral in some embodiments), and taking union of all Voronoi regions with the same label to obtain the woven tiles (e.g., woven tiles 532). The union operation may comprise a face removal operation in which shared faces of two consecutive convex polyhedral coming from two consecutive sample points on the curve formed therebetween are removed. Additionally, given that woven tiles 532 are geometrically interlocked, in order to allow for the assembly and disassembly of a structure embodying space-filling model 530, each woven tile 532 may be divided into plurality of sub-tiles or blocks 534. In some embodiments, each woven tile 532 includes a plurality of sub-tiles 534 connected end-to-end form the woven tile 532.

Figure 68:
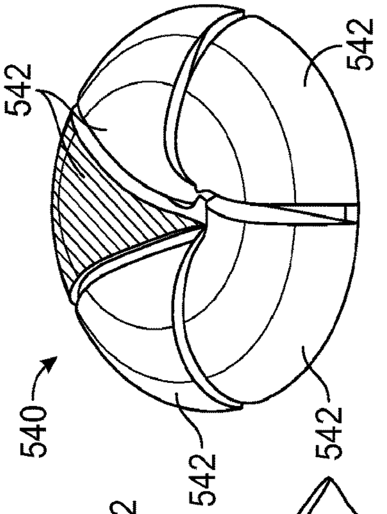
FIG. 68 is a perspective view of another space-filling solid model according to some embodiments.
Figure 69:
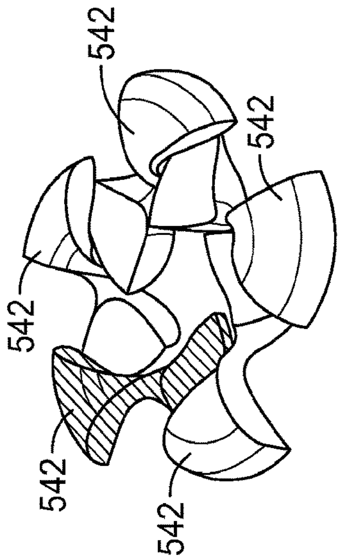
FIG. 69 is an exploded view of the space-filling solid model of FIG. 68.
Figure 70:
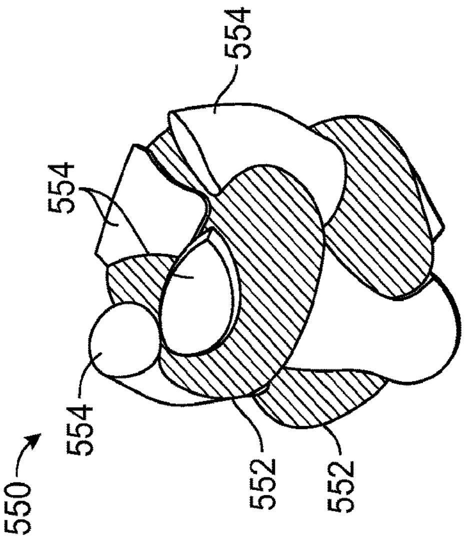
FIG. 70 is a perspective view of another space-filling solid model according to some embodiments.
Figure 71:
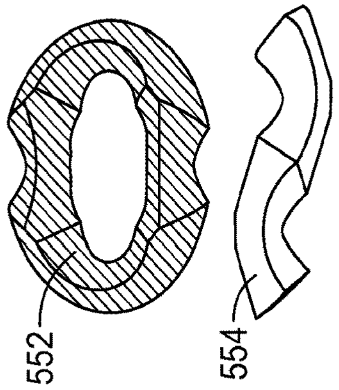
FIG. 71 is an exploded view of the space-filling solid model of FIG. 70.

The space-filling model 530 shown in FIG. 67 is brick-shaped; however, the geometry of space-filling models 530 creatable using method 10 of FIG. 1 and including woven tiles may vary from that shown in FIG. 67. For example, FIGS. 68 and 69 illustrate a toroidal space-filling model 540 including a plurality of woven, geometrically locked tiles 542. FIGS. 70 and 71 illustrate a complex-shaped space-filling model 550 including a first plurality of woven, geometrically locked tiles 552 and a second plurality of woven, geometrically locked tiles 554 that are different in geometry from the first plurality of woven tiles 552.

Figure 72:
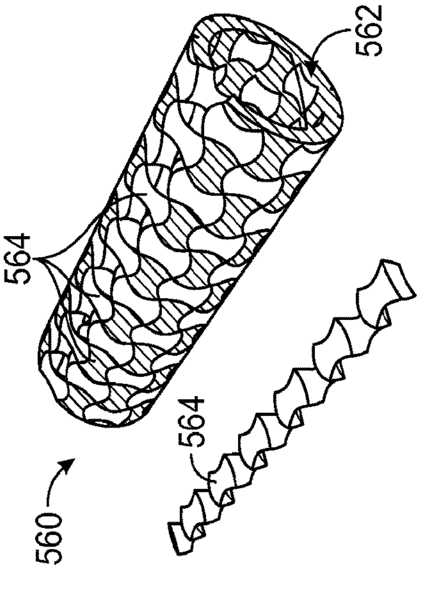
FIGS. 72-75 are perspective, partially-exploded views of other space-filling solid models according to some embodiments.
Figure 73:
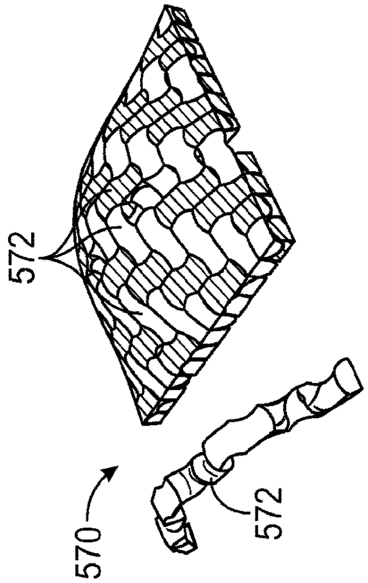
Figure 74:
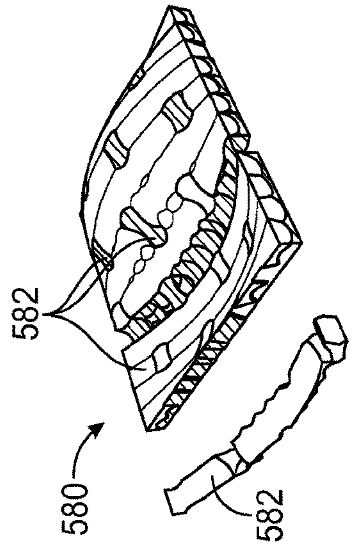
Figure 75:
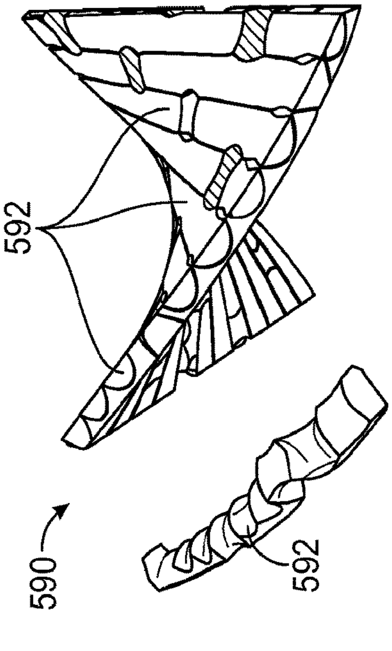

FIG. 72 illustrates an example of a cylindrical or tubular space-filling model 560 having a central opening or passage extending therethrough and including a plurality of geometrically locked, woven tiles 564. Some of woven tiles 564 extend entirely between opposing longitudinal ends of the space-filling model 560 while others of the woven tiles 564 extend circumferentially entirely about the central passage 562. FIG. 73 illustrates an example of a bi-quadratic space-filling module 570 including a plurality of geometrically locked, woven tiles 572. Space-filling module 570, along with having a different external shape as space-filling module 560, is also based on a different spatial arrangement or symmetry than that from which space-filling module 560 is based. FIG. 74 illustrates an example of a concave-convex space-filling module 580 including a plurality of geometrically locked, woven tiles 582. Space-filling module 580, along with having a different external shape as space-filling modules 560, 570, is also based on a different spatial arrangement or symmetry than that from which both space-filling modules 560, 570 are based. FIG. 75 illustrates an example of a saddle-shaped space-filling module 590 including a plurality of geometrically locked, woven tiles 592.

As described above, in some embodiments, space-filling models created using method 10 of FIG. 1 and including geometrically locked, woven tiles, may comprise sub-tiles to allow for the assembly and disassembly of the space-filling model without the need to deform any of the woven tiles during said assembly or disassembly. For example, referring to FIGS. 76, 77, an embodiment of a space-filling structure 600 is shown which includes a plurality of geometrically interlocked, woven tiles 602 extending longitudinally in orthogonal directions.

Figure 76:
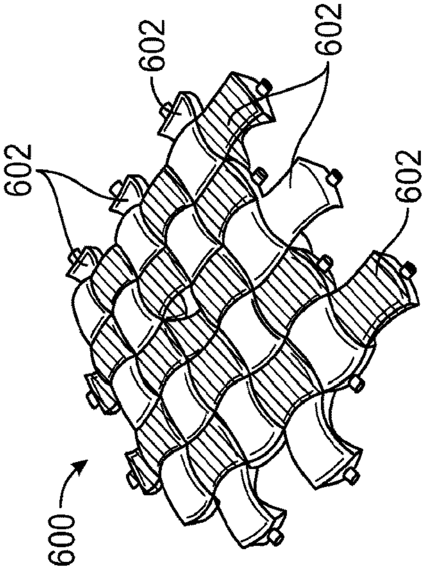
FIG. 76 is a perspective view of another space-filling structure according to some embodiments.
Figure 77:
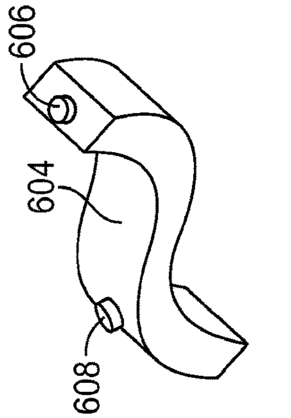
FIG. 77 is a perspective view of a sub-tile of the space-filling structure of FIG. 76 according to some embodiments.

In the embodiment of FIGS. 76, 77, each woven tile 602 may be formed from a plurality of S-shaped sub-tiles or blocks 604 which are connected end-to-end to form the woven tile 602. Particularly, each sub-tile 604 includes a male connector 606 on one longitudinal end thereof which may be received in a female connector or receptacle formed on a longitudinal end of an adjacent sub-tile 604 of a given woven tile 602. Additionally, in this embodiment, the sub-tiles 604 of each woven tile 602 are hollow including a cavity therein. Each sub-tile 604 includes a sealable port 608 in which material, such as a fluid (e.g., cement for architectural applications) may be provided to fill the cavity of each sub-tile 604 once sub-tiles 604 have been transported to a location in which they will be assembled to form space-filling structure 600. In this manner, the weight of sub-tiles 604 may be minimized during transportation to the site of their assembly. Additionally, the performance characteristics of space-filling structure 100 may be tailored to specific applications by filing the cavity of sub-tiles 604 thereof with different materials.

Figure 78:
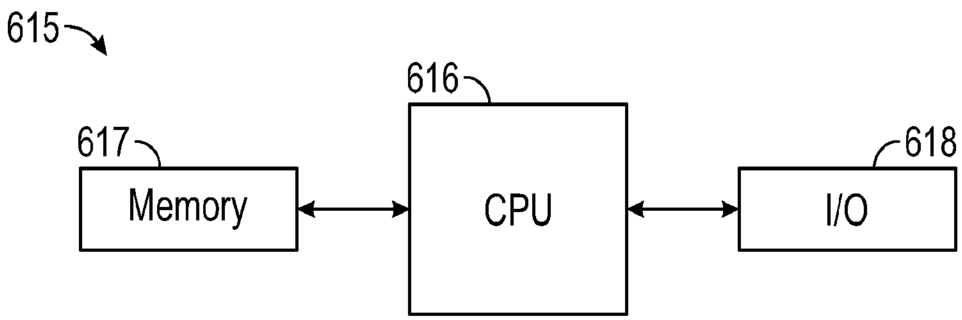
FIG. 78 is a schematic view of a computer system according to some embodiments.

Referring now to FIG. 78, an embodiment of a computer system 615 suitable for implementing one or more embodiments disclosed herein is shown. In some embodiments, the computer system 108 shown in FIG. 7 may correspond to, and be similarly configured as, computer system 615. The computer system 615 includes a processor 616 (which may be referred to as a central processor unit or CPU) that is in communication with one or more memory devices 617, and input/output (I/O) devices 618. The processor 616 may be implemented as one or more CPU chips. The memory devices 107 of computer system 615 may include secondary storage (e.g., one or more disk drives, etc.), a non-volatile memory device such as read only memory (ROM), and a volatile memory device such as random access memory (RAM). In some contexts, the secondary storage ROM 618, and/or RAM comprising the memory devices 617 of computer system 615 may be referred to as a non-transitory computer readable medium or a computer readable storage media. Processor 616 may execute machine readable instructions (e.g., non-transitory machine readable medium) provided on the corresponding memory devices 617 to provide the processor with all of the functionality described herein. I/O devices 618 may include printers, video monitors, liquid crystal displays (LCDs), touch screen displays, keyboards, keypads, switches, dials, mice, and/or other well-known input devices. I/O devices 618 may also include devices configured to create a space-filling structure based on a space-filling solid model created by the method 10 of FIG. 1. For example, I/O devices 618 may include an additive manufacturing system such as a 3D printer, a molding system, a casting system, etc.

It is understood that by programming and/or loading executable instructions onto the computer system 615, at least one of the processor 616, the memory devices 617 are changed, transforming the computer system 615 in part into a particular machine or apparatus having the novel functionality taught by the present disclosure. Additionally, after the computer system 615 is turned on or booted, the processor 616 may execute a computer program or application. For example, the processor 616 may execute software or firmware stored in the memory devices 617. During execution, an application may load instructions into the processor 616, for example load some of the instructions of the application into a cache of the processor 616. In some contexts, an application that is executed may be said to configure the processor 616 to do something, e.g., to configure the processor 616 to perform the function or functions promoted by the subject application. When the processor 616 is configured in this way by the application, the processor 616 becomes a specific purpose computer or a specific purpose machine.

Computer system 615 is configured to execute one or more of the blocks 12-20 of the method 10 shown and described in FIG. 1. For example, processor 616 may execute a software application stored in memory devices 617 and which is configured to execute one or more of the blocks 12-20 of method 10. A designer may interact with the software application executing on computer system 615 through I/O devices 618. For example, using I/O devices 618, the designer may within the software application define a 3D domain to be partitioned, define a Voronoi site geometry for a plurality of Voronoi sites, define a special arrangement or symmetry of the plurality of Voronoi sites, and select one or more distance functions. Based on the inputs provided by the designer, the software application executing on computer system 615 may partition the 3D domain based on the defined geometry and spatial arrangement of the Voronoi sites using the selected distance function to create a space-filling model which may be saved in the memory devices 617.

While exemplary embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A computer-implemented method for creating a space-filling solid model, the method comprising:

(a) defining a three-dimensional (3D) domain;

(b) defining a 3D Voronoi site geometry for each of a plurality of Voronoi sites, the Voronoi site geometry characterized by at least one curve or at least one surface extending in three dimensions;

(c) defining a spatial arrangement of the plurality of Voronoi sites;

(d) arranging the plurality of Voronoi sites within the 3D domain according to the defined spatial arrangement; and (e) partitioning the 3D domain based on the Voronoi site geometry of each the plurality of Voronoi sites defined in (b) and the spatial arrangement of the plurality of Voronoi sites defined in (c) using a distance function to create the space-filling solid model.

2. The method of claim 1, wherein the space-filling solid model comprises a plurality of repeating parts in a plurality of orientations, wherein each part is formed from one Voronoi site of the plurality of Voronoi sites.

3. The method of claim 2, wherein the spatial arrangement comprises a weave symmetry and the plurality of repeating parts are geometrically locked.

4. The method of claim 3, wherein the Voronoi site geometry comprises a weave line.

5. The method of claim 2, wherein the spatial arrangement comprises a weave symmetry and the plurality of repeating parts are topologically locked, and wherein the plurality of repeating parts comprise Generalized Abeille Tiles.

6. The method of claim 1, wherein (e) comprises:

(e1) dividing the 3D domain into a plurality of two-dimensional (2D) stacked layers;

(e2) partitioning each of the 2D stacked layers based on the defined Voronoi site geometry of the plurality of Voronoi sites using the distance function; and (e3) interpolating, layer-by-layer, the partitioned 2D stacked layers to create the space-filling solid model.

7. A computer-implemented method for creating a space-filling solid model, comprising:

(a) defining a three-dimensional (3D) domain;

(b) defining a 3D Voronoi site geometry for each of a plurality of Voronoi sites, the Voronoi site geometry characterized by at least one curve or at least one surface extending in three dimensions;

(c) arranging the plurality of Voronoi sites within the 3D domain;

(d) dividing the 3D domain into a plurality of two-dimensional (2D) stacked layers;

(e) partitioning each of the 2D stacked layers based on the Voronoi site geometry of each of the plurality of Voronoi sites defined in (b) using a distance function; and (f) interpolating, layer-by-layer, the partitioned 2D stacked layers to create the space-filling solid model.

8. The method of claim 7, wherein the space-filling solid model comprises a plurality of repeating parts in a plurality of orientations, wherein each part is formed from one Voronoi site of the plurality of Voronoi sites.

9. The method of claim 8, wherein the plurality of repeating parts comprise woven threads that are geometrically interlocked.

10. The method of claim 9, wherein each of the woven threads comprises a plurality of separable sub-tiles.

11. The method of claim 10, wherein each of the plurality of separable sub-tiles is hollow, wherein each of the plurality of separable sub-tiles comprises a connector located at an end thereof and a port, and wherein the plurality of separable sub-tiles are connected end-to-end to form the woven thread.

12. The method of claim 7, wherein the space-filling solid model comprises a connector and the plurality of repeating parts are geometrically interlocked.

13. A non-transitory machine-readable medium including instructions that, when executed by a processor, cause the processor to:

define a three-dimensional (3D) domain;

define a 3D Voronoi site geometry for each of a plurality of Voronoi sites, the Voronoi site geometry characterized by at least one curve or at least one surface extending in three dimensions;

define a spatial arrangement of the plurality of Voronoi sites;

arrange the plurality of Voronoi sites within the 3D domain according to the defined spatial arrangement; and partition the 3D domain based on the defined Voronoi site geometry of each of the plurality of Voronoi sites and the defined spatial arrangement of the plurality of Voronoi sites using a distance function to create a space-filling solid model.

14. The non-transitory machine-readable medium of claim 13, wherein the space-filling solid model comprises a plurality of repeating parts in a plurality of orientations, wherein each part is formed from one Voronoi site of the plurality of Voronoi sites.

15. The non-transitory machine-readable medium of claim 14, wherein the spatial arrangement comprises a weave symmetry and the plurality of repeating parts are topologically locked, and wherein the plurality of repeating parts comprise Generalized Abeille Tiles.

16. The non-transitory machine-readable medium of claim 15, wherein:

the plurality of repeating parts comprise woven threads that are geometrically interlocked, and wherein each of the woven threads comprises a plurality of separable sub-tiles;

and each of the plurality of separable sub-tiles is hollow, wherein each of the plurality of separable sub-tiles comprises a connector located at an end thereof and a port, and wherein the plurality of separable sub-tiles are connected end-to-end to form the woven thread.

17. The non-transitory machine-readable medium of claim 13, wherein, the instructions, when executed by a processor, cause the processor to define at least one of the three-dimensional (3D) 3D domain, the Voronoi site geometry, and the spatial arrangement of the plurality of Voronoi sites based on a desired behavior of the space-filling solid model inputted by a user.

18. The non-transitory machine-readable medium of claim 13, wherein, the instructions, when executed by a processor, cause the processor to:

divide the 3D domain into a plurality of two-dimensional (2D) stacked layers;

partition each of the 2D stacked layers based on the defined Voronoi site geometry of the plurality of Voronoi sites using the distance function; and interpolate, layer-by-layer, the partitioned 2D stacked layers to create the space-filling solid model.

* * * * *